United States Patent
Xie et al.

(10) Patent No.: US 12,424,539 B2
(45) Date of Patent: Sep. 23, 2025

(54) LOCAL ENLARGED VIA-TO-BACKSIDE POWER RAIL

(71) Applicant: International Business Machines Corporation, Armonk, NY (US)

(72) Inventors: Ruilong Xie, Niskayuna, NY (US); Albert M. Chu, Nashua, NH (US); Carl Radens, LaGrangeville, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 489 days.

(21) Appl. No.: 17/903,644

(22) Filed: Sep. 6, 2022

(65) Prior Publication Data

US 2024/0079316 A1 Mar. 7, 2024

(51) Int. Cl.
| | |
|---|---|
| *H01L 23/52* | (2006.01) |
| *H01L 21/74* | (2006.01) |
| *H01L 23/48* | (2006.01) |
| *H01L 23/522* | (2006.01) |
| *H01L 23/528* | (2006.01) |

(52) U.S. Cl.
CPC ........ *H01L 23/5226* (2013.01); *H01L 21/743* (2013.01); *H01L 23/481* (2013.01); *H01L 23/5286* (2013.01)

(58) Field of Classification Search
CPC . H01L 23/5226; H01L 21/743; H01L 23/481; H01L 23/5286; H01L 21/76895; H01L 21/76898; H10D 30/014; H10D 30/43; H10D 30/6735; H10D 30/6757; H10D 62/822; H10D 62/121; H10D 64/254; H10D 84/0149; H10D 84/038; H10D 84/0135; H10D 84/0151; B82Y 10/00

USPC .......................................................... 257/774
See application file for complete search history.

(56) References Cited

U.S. PATENT DOCUMENTS

| | | |
|---|---|---|
| 9,570,395 B1 | 2/2017 | Sengupta et al. |
| 10,388,519 B2 | 8/2019 | Smith et al. |
| 10,586,765 B2 | 3/2020 | Smith et al. |
| 10,636,739 B2 | 4/2020 | Beyne et al. |
| 10,700,207 B2 | 6/2020 | Chen et al. |
| 2020/0043945 A1 | 2/2020 | Kim et al. |
| 2020/0105671 A1 | 4/2020 | Lai et al. |
| 2021/0202499 A1 | 7/2021 | Gardner et al. |
| 2021/0336063 A1* | 10/2021 | Liao ................... H01L 23/5286 |

(Continued)

FOREIGN PATENT DOCUMENTS

| | | |
|---|---|---|
| CN | 119856590 A | 4/2025 |
| WO | 2024/052749 A1 | 3/2024 |

OTHER PUBLICATIONS

Prasad, E., et al., "Buried Power Rails and Back-side Power Grids: Arm® CPU Power Delivery Network Design Beyond 5nm", 2019 IEEE International Electron Devices Meeting (IEDM), Date of Conference: Dec. 7-11, 2019, 4 pages.

(Continued)

*Primary Examiner* — Mohammad M Hoque
(74) *Attorney, Agent, or Firm* — Scully, Scott, Murphy & Presser, P.C.; Kimberly Zillig

(57) ABSTRACT

A semiconductor structure having improved performance is provided that includes a local enlarged via-to-backside power rail (VBPR) contact structure which connects a source/drain region of one field effect transistor (FET) to a backside power rail.

19 Claims, 26 Drawing Sheets

(56) References Cited

U.S. PATENT DOCUMENTS

| | | |
|---|---|---|
| 2022/0131004 A1 | 4/2022 | Chen et al. |
| 2022/0157722 A1 | 5/2022 | Bouche et al. |
| 2022/0181197 A1* | 6/2022 | Tao .................... H01L 23/5226 |
| 2022/0238370 A1 | 7/2022 | Chen et al. |
| 2022/0271139 A1 | 8/2022 | Su et al. |
| 2023/0139929 A1 | 5/2023 | Xie et al. |

OTHER PUBLICATIONS

Mathur, R., et al., "Buried Bitline for sub-5nm SRAM Design", 2020 IEEE International Electron Devices Meeting (IEDM), Date of Conference: Dec. 12-18, 2020, 4 pages.
International Search Report together with the Written Opiniondated Oct. 30, 2023, received in a corresponding foreign application, 10 pages.

* cited by examiner

Section Y1

Section Y1

Section Y2

Section Y1

Section Y2

Section Y1

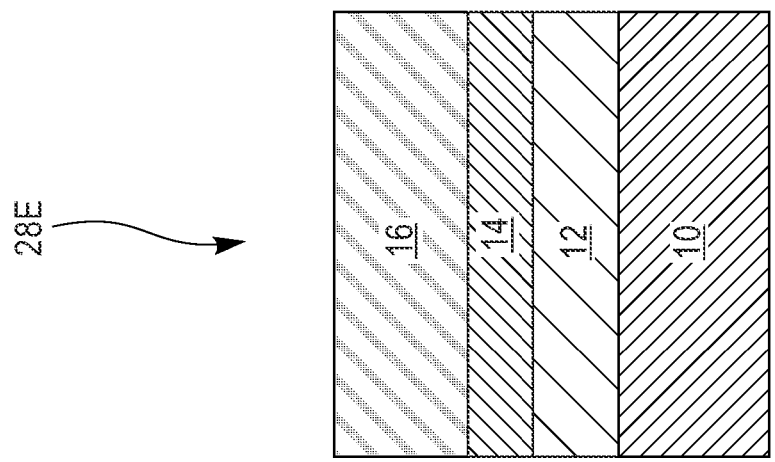
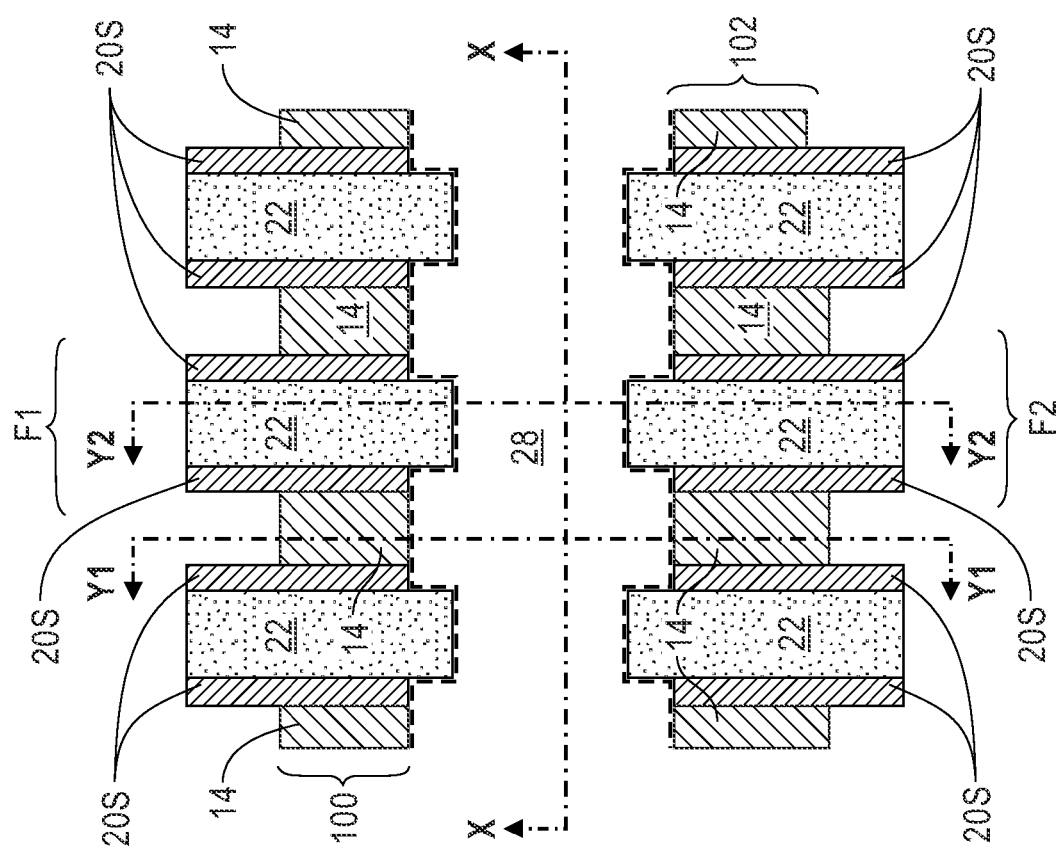
FIG. 3B
Section Y1
FIG. 3A

Section Y2

Section Y1

Section Y1

Section Y2

Section Y1

Section Y1

Section Y2

Section Y1

Section Y1

Section Y2

Section Y1

Section Y1

Section Y1

Section Y2

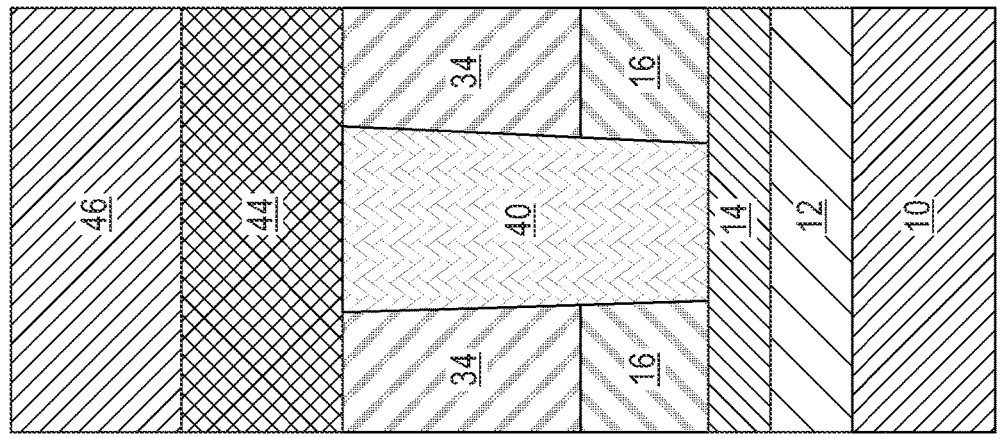
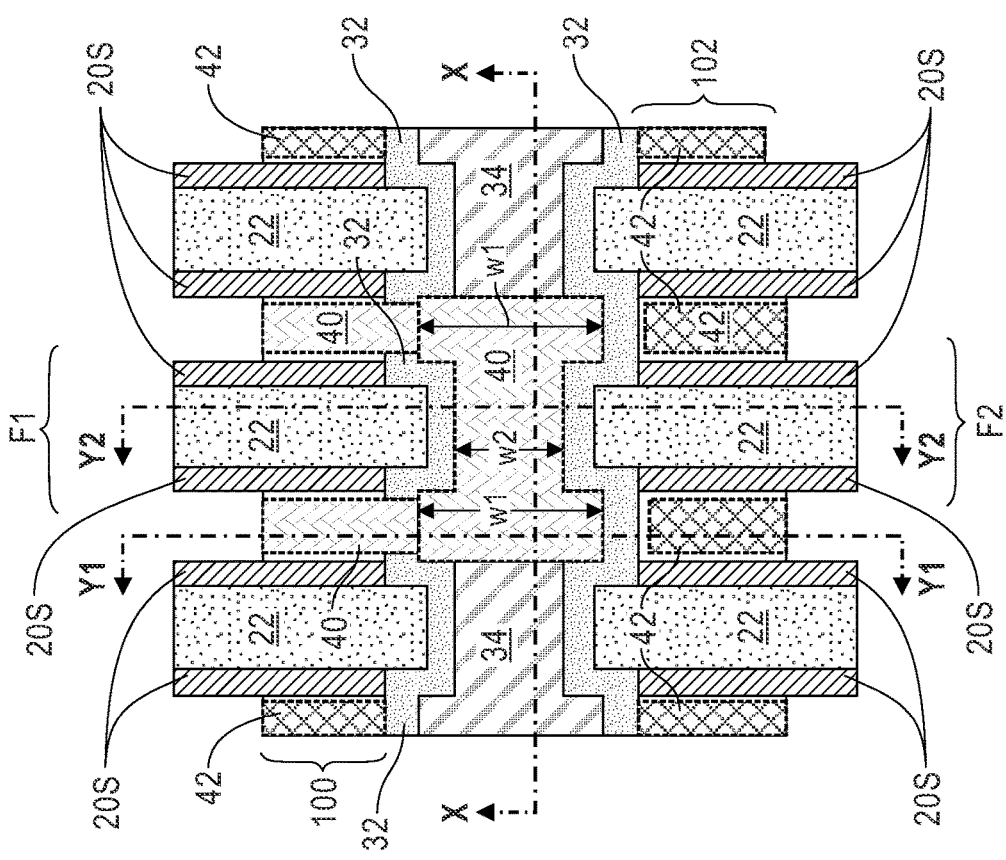
FIG. 8B
Section Y1
FIG. 8A

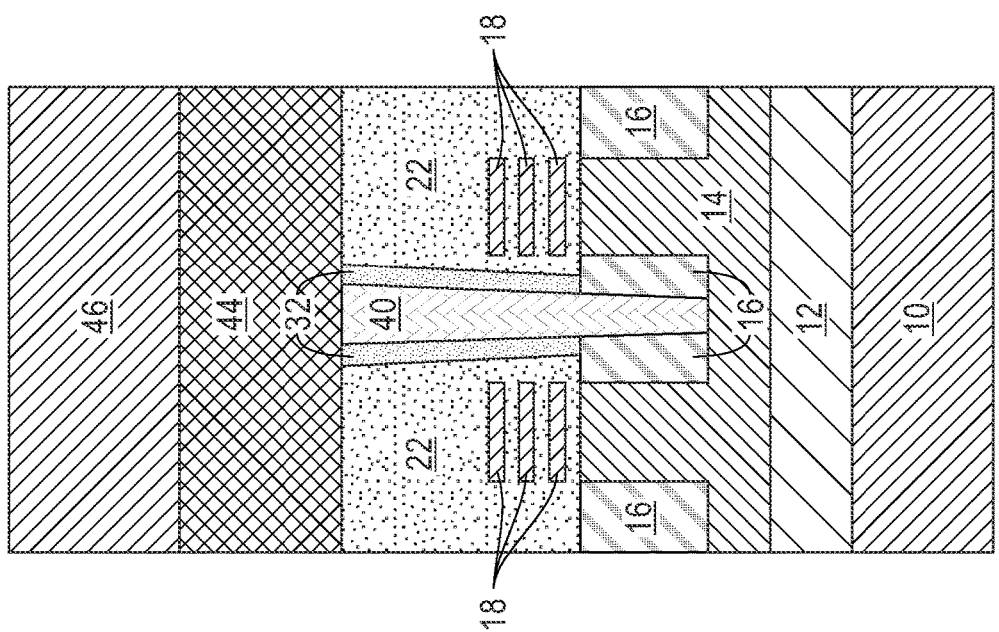
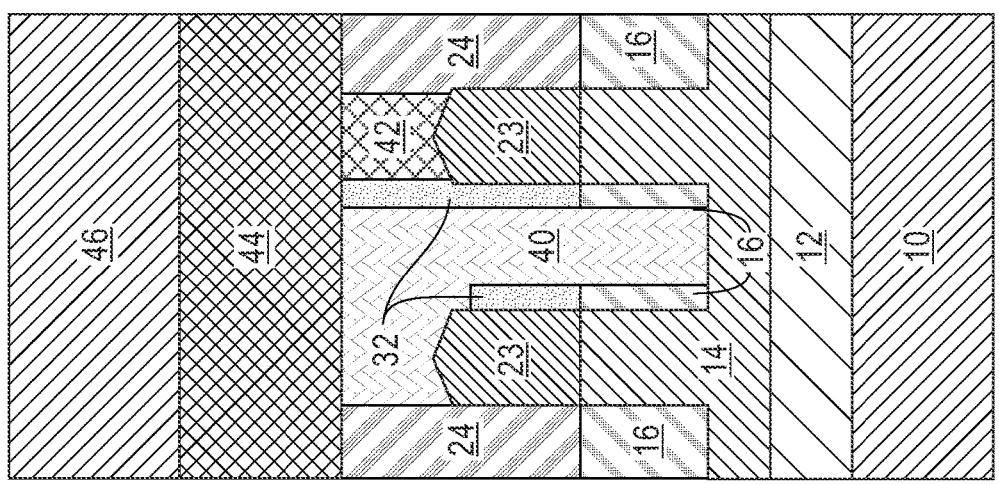
FIG. 8D
Section Y2
FIG. 8C
Section Y1

Section Y1

Section Y2

Section Y1

Section Y1

Section Y2

Section Y1

Section Y1

Section Y2

Section Y1

FIG. 12B Section Y1

Section Y2

Section Y1

Section Y1

Section Y2

Section Y1

LOCAL ENLARGED VIA-TO-BACKSIDE POWER RAIL

BACKGROUND

The present application relates to semiconductor technology, and more particularly to a semiconductor structure containing a local enlarged via-to-backside power rail (VBPR) contact structure which improves the performance of the circuit containing the same.

When forming a structure including a plurality of complementary metal oxide semiconductor (CMOS) devices, such as integrated circuits, standard cells may be used as a base unit for designing and manufacturing the integrated circuits. The standard cell(s) may be used to form one or more functional circuits, and each standard cell may have the same footprint (e.g., may have a standard footprint). Using standard cells when designing complex circuits and components reduces design and manufacture costs.

In use, each standard cell of a semiconductor structure requires power input (Vdd) and ground (Vss) connections. To power the various components thereof, each standard cell is generally coupled to a backside power rail which is electrically connected to an active layer of the standard cell to provide the power (Vdd). In some instances, a plurality of backside power rails may be provided for each standard cell to respectively provide the power (Vdd) and the ground (Vss).

Backside power rails are typically formed on the backside of the wafer. Such backside power rails are connected to a source/drain region of a field effect transistor (FET) utilizing a VBPR contact structure. The size of prior art VBPR contact structures is limited by the contacted poly pitch that is present between two adjacent gate structures.

SUMMARY

A semiconductor structure having improved performance is provided that includes a local enlarged VBPR contact structure which connects one of the source/drain regions of a field effect transistor (FET) to a backside power rail. In the present application, the term "via-to-backside power rail contact structure or VBPR contact structure" denotes a contact structure that has a via portion that connects to the backside power rail, and a non-via portion that connects to one of the source/drain regions of the FET.

In one aspect of the present application, a semiconductor structure is provided. In one embodiment of the present application, the semiconductor structure includes a first active device region including a first FET having a first source/drain region and a second source/drain region, and a second active device region located adjacent to the first active device region and including a second FET, wherein an end wall of a functional gate structure of the first FET faces an end wall of a functional gate structure of the second FET. A gate cut region is located between the first FET and the second FET, and a VBPR contact structure is present in the gate cut region that is located between the first FET and the second FET. In the present application, the VBPR contact structure contacts a backside power rail and the first source/drain region of the first FET. Thus, the VBPR contact structure wires the first FET to the backside power rail.

In some embodiments of the present application, the VBPR contact structure extends from the first source/drain region to the second source/drain region of the first FET through the gate cut region. This allows for coupling between first and second source/drain regions of the first FET utilizing a single VBPR contact structure.

In some embodiments of the present application, the VBPR has a first width in an area between the first source/drain region of the first FET and a first source/drain region of the second FET and between the second source/drain region of the first FET and a second source/drain region of the second FET, and a second width in area between the end wall of the functional gate structure of the first FET and the end wall of the functional gate structure of the second FET, wherein the first width is larger than the second width. This provides an enlarged VPBR contact structure which, in turn, improves performance of the device.

In some embodiments of the present application, the gate cut region includes a bi-layer dielectric fill structure including an inner dielectric material layer and an outer dielectric material layer. In such embodiments, the outer dielectric material layer is present around the end wall of the functional gate structure of both first FET and the second FET. The bi-layer dielectric fill structure provides electrically insulation between the VPBR contact structure and the first and second FETs.

In some embodiments of the present application, the structure further includes a front side source/drain contact structure contacting each of a first source/drain region of the second FET and a second source/drain region of the second FET, wherein the outer dielectric material layer is present between the front side source/drain contact structure and the VBPR contact structure. This provides wiring to front side devices.

In some embodiments of the present application, the structure further includes a front side back-end-of-the-line (BEOL) structure contacting at least the VBPR contact structure. In such embodiments, a carrier wafer can be located on the front side BEOL structure.

In some embodiments of the present application, the backside power rail is located in a backside interlayer dielectric (ILD) material layer. In some embodiments of the present application, the structure further includes a backside power distribution network contacting both the backside ILD material layer and the backside power rail. This provides integration of the structure to a backside power distribution network.

In some embodiments of the present application, the structure includes a shallow trench isolation structure laterally surrounding a portion of the VBPR contact structure. In such embodiments, the shallow trench isolation structure contacts a surface of the backside power rail.

In some embodiments of the present application, the VBPR contact structure has a surface opposite a surface that contacts the backside power rail that is coplanar with a surface of both the first FET and the second FET.

In some embodiments of the present application, each of the first FET and the second FET is a nanosheet-containing FET. In such embodiments, the nanosheet-containing FET includes the functional gate structure of the first FET and the second FET wrapping around a plurality of vertically stacked semiconductor channel material nanosheets.

In some embodiments of the present application, the structure further includes a gate spacer located laterally adjacent the functional gate structure of the first FET and the second FET, wherein the gate spacer is absent from a portion of a sidewall of the functional gate structure of the first FET and the second FET that is in proximity to the gate cut region. The allows for an enlarged VBPR contact structure.

In some embodiments of the present application, the VBPR contact structure is entirely spaced apart from the second FET present in the second active device region by an outer dielectric material layer of a bi-layer dielectric fill structure that is present in the gate cut region.

In some embodiments of the present application, sidewalls of the functional gate structure of the first FET are aligned to sidewalls of the functional gate structure of the second FET.

In some embodiments of the present application, a sidewall of the first source/drain region of the first FET is spaced apart from the VBPR contact structure by an outer dielectric material layer of a bilayer dielectric fill structure that is present in the gate cut region.

In another aspect of the present application, a method of forming a semiconductor structure is provided. The method including performing a cut gate after formation of functional gate structures and source/drain regions (i.e., FETs). A bilayer dielectric material fill structure is then formed in the gate cut region that is provided by this gate cutting process. An inner dielectric material layer of the bilayer dielectric material fill structure is selectively removed and thereafter a VBPR contact structure is formed in the area that previously included the inner dielectric material layer and atop one of the source/drain regions. The VBPR contact structure is then connected to a backside power rail.

BRIEF DESCRIPTION OF THE DRAWINGS

FIGS. 3A-3D are various views of the exemplary structure shown in FIGS. 2A-2D, respectively, after enlarging a width of the gate cut trench between the source/drain regions of the cut functional gate structures, and reducing the length of each gate spacer to physically expose sidewalls of each cut functional gate structure that are in proximity to the gate cut trench.

FIGS. 8A-8D are various views of the exemplary structure shown in FIGS. 7A-7D, respectively, after forming a front side back-end-of-the-line (BEOL) structure and a carrier wafer.

FIGS. 12A-12D are various views of the exemplary structure shown in FIGS. 11A-11D, respectively, after forming a backside ILD material layer and forming a backside power rail in the backside ILD material layer.

DETAILED DESCRIPTION

Figure 1B:
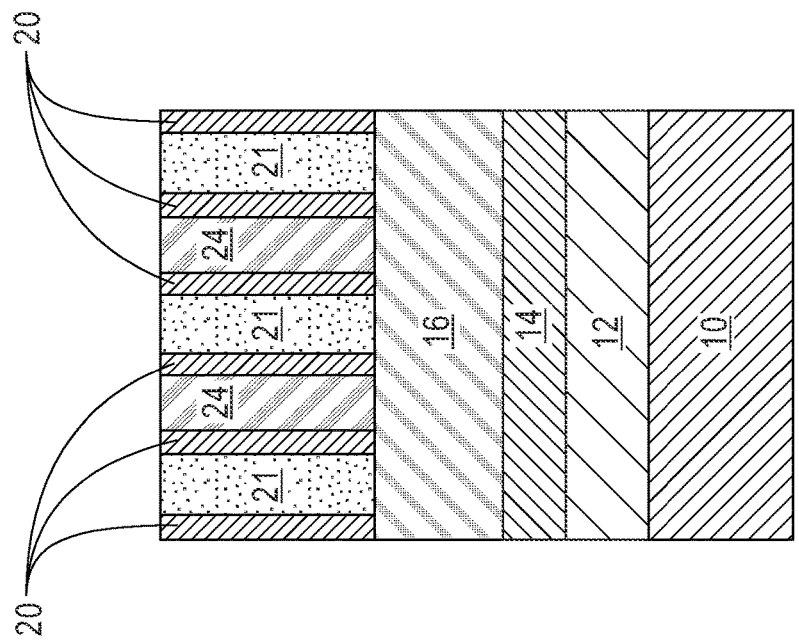
FIGS. 1A-1D are various views of an exemplary structure that can be used in the present application, the exemplary structure includes a plurality of uncut functional gate structures that are oriented parallel to each other and perpendicular to two spaced apart active device regions, within each active device region the uncut functional gate structures wrap around a plurality of vertically stacked semiconductor channel material nanosheets, and also within each active device region there is present a source/drain region on opposing sides of the uncut functional gate structures, the exemplary structure also includes a semiconductor substrate and a front side interlayer dielectric material (ILD) layer located between each of the uncut functional gate structures.
Figure 1A:
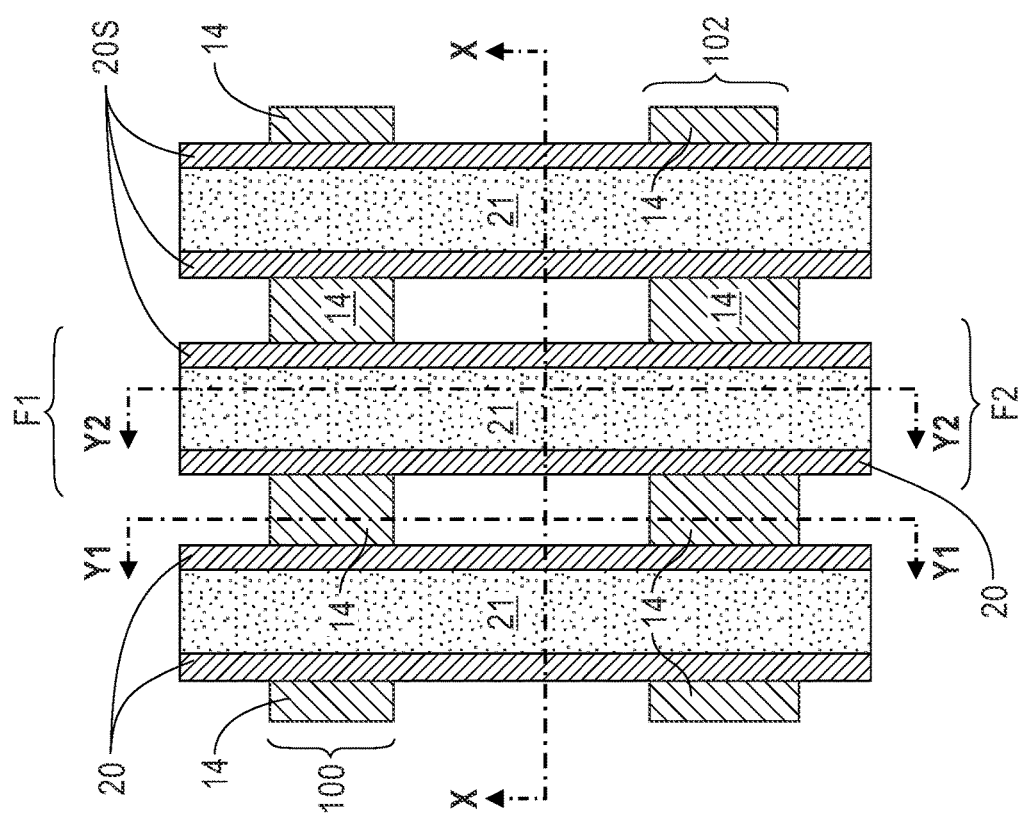

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Before discussing the present application in detail, the present application provides various views showing an exemplary structure through various processing steps of the present application. The various processing steps include performing a cut gate after formation of functional gate structures and source/drain regions (i.e., FETs), forming a bilayer dielectric material fill structure in the gate cut region that is provided by this gate cutting process, selectively removing an inner dielectric material layer of the bilayer dielectric material fill structure, forming a VBPR contact structure in the area that previously included the inner dielectric material layer and atop one of the source/drain regions. The VBPR contact structure is then connected to a backside power rail.

Notably, FIGS. 1A, 2A, 3A, 4A, 5A, 6A, 7A, 8A, 9A, 10A, 11A, 12A and 13A are top down views illustrating a device layout of the exemplary structure that can be employed in the present application. In those top down views, only essential elements/components required for orientation purposes are shown; non-essential elements/components not required for orientation purposes have been omitted from the top down views. Each of the top down views includes a cut X-X, a cut Y1-Y2 and a cut Y2-Y2. Cut X-X is an area that is located between two active device regions (i.e., a first active device region 100 and a second active device region 102) in which gate cutting will occur; this area is referred to herein as a gate cut region. Cut Y1-Y1 is in an area located between two adjacent gate structures (i.e., uncut functional gate structures 21 or cut functional gate structures 22) along the length of the gate structures. Cut Y2-Y2 is through one of the gate structures (i.e., uncut functional gate structures 21 or cut functional gate structures 22). The Y1-Y1 and Y2-Y2 cuts extend through the first active device region 100, the gate cut region, and the second active device region 102. FIGS. 1B, 2B, 3B, 4B, 5B, 6B, 7B, 8B, 9B, 10B, 11B, 12B and 13B are cross sectional views along cut X-X, FIGS. 1C, 2C, 3C, 4C, 5C, 6C, 7C, 8C, 9C, 10C, 11C, 12C and 13C are cross sectional views along cut Y1-Y1, and FIGS. 1D, 2D, 3D, 4D, 5D, 6D, 7D, 8D, 9D, 10D, 11D, 12D and 13D are cross sectional views along cut Y2-Y2, In the present application, the term "active device region" denotes an area in which functional devices such as, for example, FETs, are formed.

It is noted that although the present application describes and illustrates nanosheet-containing FETs, i.e., FETs in which a functional gate structure is wrapped around a plurality of vertically stacked semiconductor channel material nanosheets, the present application works for other types of FETs such as, for example, planar FETs, finFETs, stacked FETs, or semiconductor nanowire FETs. In the present application, the term "FEY" is used to describe a device that includes a functional gate structure that contacts a semiconductor channel material structure and has a source/drain region located on each side of the functional gate structure.

Referring first to FIGS. 1A-1D, there are shown through various views an exemplary structure that can be used in the present application. The exemplary structure includes a plurality of uncut functional gate structures 21 that are oriented parallel to each other and perpendicular to two spaced apart active device regions (i.e., first active device region 100 and second active device region 102). The term "uncut" when used in junction with the term "functional gate structure" denotes that the functional gate structure runs continuously from the first active device region 100 to the second active device region 102 without any breaks or gaps formed therein. Within each active device region (i.e., the first active device region 100 and the second active device region 102), each uncut functional gate structure 21 wraps around a plurality of vertically stacked semiconductor channel material nanosheets 21, and also within each active device regions (i.e., first active device region 100 and second active device region 102) there is present a source/drain region 23 on opposing sides of the uncut functional gate structures 21. The exemplary structure also include a semiconductor substrate 10/12/14, shallow trench isolation structure 16, a gate dielectric spacer 20 that is located on sidewalls of each uncut functional gate structure 21, and a front side interlayer dielectric material (ILD) material 24 layer that is located between each of the uncut functional gate structures 21 and on top of the source/drain regions 23. As is shown, each source/drain region 23 contacts a surface of the semiconductor substrate.

The semiconductor substrate includes a first semiconductor material layer 10, an etch stop layer 12 and a second semiconductor material layer 14. The first semiconductor material layer 10 of the semiconductor substrate is composed of a first semiconductor material having semiconducting properties. Examples of first semiconductor materials that can be used to provide the first semiconductor material layer 10 include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material layer 14 of the semiconductor substrate is composed of a second semiconductor material. The second semiconductor material that provides the second semiconductor material layer 14 can be compositionally the same as, or compositionally different from the first semiconductor material that provides the first semiconductor material layer 10. In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the semiconductor material that provides both the first semiconductor material layer 10 and the second semiconductor material layer 14. In one example, the first semiconductor material layer 10 is composed of silicon, the etch stop layer 12 is composed of silicon dioxide, and the second semiconductor material layer 14 is composed of silicon. Such a semiconductor substrate including silicon/silicon dioxide/silicon can be referred to as a silicon-on-insulator (SOI) substrate. In another example, the first semiconductor material layer 10 is composed of silicon, the etch stop layer 12 is composed of silicon germanium, and the second semiconductor material layer 14 is composed of silicon. Such a semiconductor substrate including silicon/silicon germanium/silicon can be referred to as a bulk semiconductor substrate.

Figure 1C:
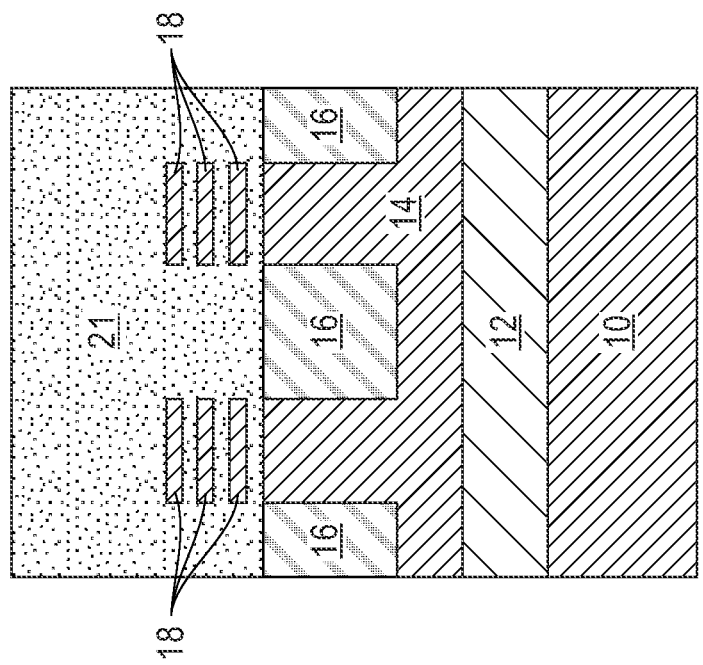
Figure 1D:
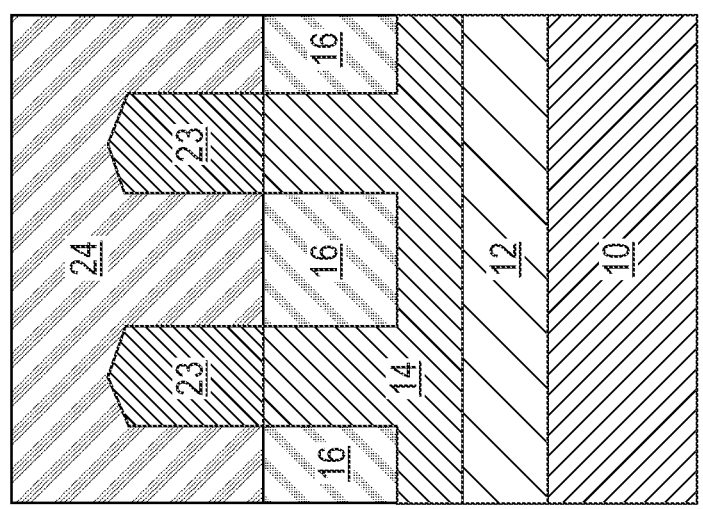

The shallow trench isolation structure 16 is composed of any trench dielectric material such as, for example, silicon oxide. In some embodiments, a trench dielectric material such as, for example, SiN, can be present along a sidewall and a bottom wall of the trench dielectric material. As is shown in FIG. 1B, each uncut functional gate structure 21 and the gate spacer 20 land on a surface of the shallow trench isolation structure 16, and as is shown in FIG. 1C, the shallow trench isolation structure 16 is located laterally adjacent to a non-etched portion of the second semiconductor material layer 14 of the semiconductor substrate.

Each semiconductor channel material nanosheet 18 is composed of one of the semiconductor materials mentioned above for the first semiconductor material layer 10 of the semiconductor substrate. The semiconductor material that provides each semiconductor material nanosheet 18 can be compositionally the same as, or compositionally different from, the second semiconductor material that provides the second semiconductor layer 14 of the semiconductor substrate. In some embodiments, each semiconductor channel material nanosheet 18 is composed of a semiconductor material capable of providing high channel mobility for nFET devices. In other embodiments, each semiconductor channel material nanosheet 18 is composed of a semiconductor material capable of providing high channel mobility for pFET devices. In one example, each semiconductor material nanosheet 18 is composed of silicon. In the present application, a plurality of semiconductor material nanosheet 18 are present.

Each uncut functional gate structure 21 includes at least a gate dielectric material layer and a gate electrode; the gate dielectric material layer and the gate electrode are not separately illustrated in the drawings of the present application. As is known, the gate dielectric material layer of the uncut functional gate structure 21 is in direct contact with each semiconductor channel material nanosheet 18, and the gate electrode is located on the gate dielectric material layer. In some embodiments, the gate structure includes a work function metal (WFM) layer (not shown) located between the gate dielectric material layer and the gate electrode. In other embodiments, the WFM layer is used solely as the gate electrode.

The gate dielectric material layer of each uncut functional gate structure 21 is composed of a gate dielectric material such as, for example silicon oxide, or a dielectric material having a dielectric constant greater than 4.0 (such dielectric materials can be referred to as a high-k gate dielectric material). All dielectric constants mentioned herein are measured in a vacuum unless otherwise stated. Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The high-k gate dielectric material can further include dopants such as lanthanum (La), aluminum (Al) and/or magnesium (Mg).

The gate electrode of each uncut functional gate structure 21 can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide.

In some embodiments, a WFM layer can be employed as either the electrically conductive metal-containing material that provides the gate electrode or as a separate layer that is located between the gate dielectric material prior layer and the gate electrode. The WFM layer can be used to set a threshold voltage of the FET to a desired value. In some embodiments, the WFM layer can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM layer can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The gate spacer 20 is composed of a gate spacer dielectric material. Examples of gate spacer dielectric materials that can be used in providing the gate spacer 20 include, but are not limited to, SiN, SiBCN, SiOCN or SiOC. Although not shown in any of the illustrated views, the exemplary structure further includes inner spacers which are present between end portions of each of the semiconductor channel material nanosheets 18 within each vertical stack of semiconductor channel material nanosheets 18, and beneath an end portion of the bottommost semiconductor channel nanosheet and the semiconductor substrate 10/12/14. Each inner spacer is composed one of the gate spacer dielectric materials mentioned above for gate spacer 20. The gate spacer dielectric material that provides the inner spacer can be compositionally the same as, or compositionally different from, the gate dielectric spacer material that provides the gate spacer 20.

Each source/drain region 23 is composed of a semiconductor material and a dopant. As used herein, a "source/drain or S/D" region can be a source region or a drain region depending on subsequent wiring and application of voltages during operation of the field effect transistor (FET). As is known, source/drain regions are located on each side of a gate structure. The semiconductor material that provides the source/drain region 23 can include one of the semiconductor materials mentioned above for the first semiconductor material layer 10 of the semiconductor substrate. The semiconductor material that provides the source/drain regions 23 can be compositionally the same as, or compositionally different from, each semiconductor channel material nanosheet 18. The dopant that is present in the source/drain regions 23 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium.

"N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain regions 23 can have a dopant concentration of from $4\times10^{20}$ atoms/cm$^3$ to $3\times10^{21}$ atoms/cm$^3$.

The front side ILD material layer 24 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In addition to being present between each of the uncut functional gate structures 21, the front side ILD material layer 24 also is embeds the source/drain regions 23 as is shown in FIG. 1C.

The exemplary structure shown in FIGS. 1A-1D can be formed utilizing any well-known nanosheet-containing transistor formation process. So as not to obscure the method of the present application and the resultant structure that is formed by the method of the present application, the processing steps used in forming the exemplary structure shown in FIGS. 1A-1D are not described herein.

Figure 2B:
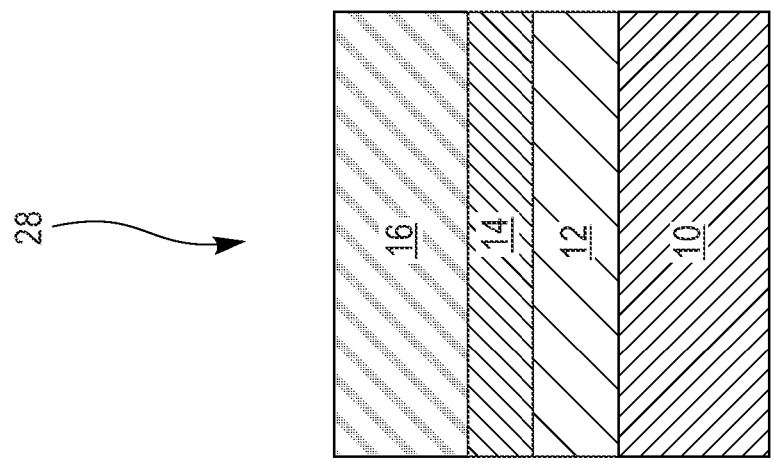
FIGS. 2A-2D are various views of the exemplary structure shown in FIGS. 1A-1D, respectively, after cutting each functional gate structure that is located between the two active device regions to provide a gate cut trench located between the two active device regions and to provide cut functional gate structures in each active device region, wherein an end wall of the cut functional gate structure in one of the active device regions faces an end wall of the cut functional gate structure in the other active device region.
Figure 2A:
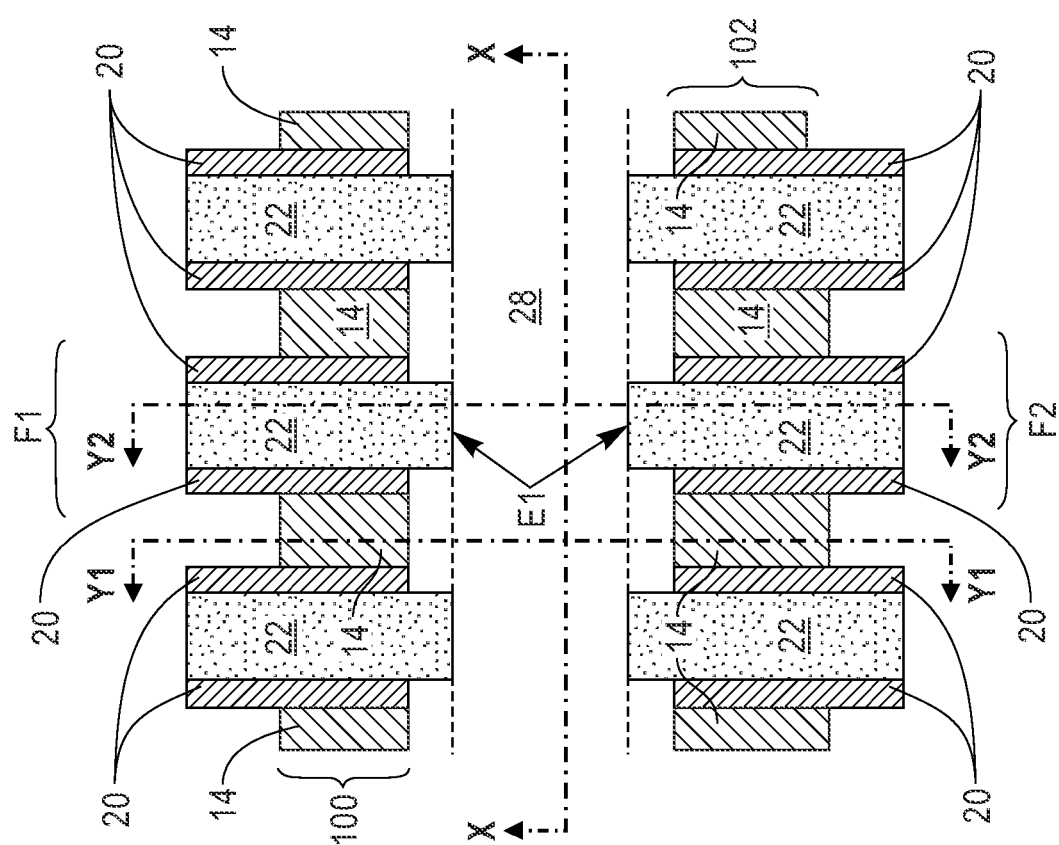
Figure 2D:
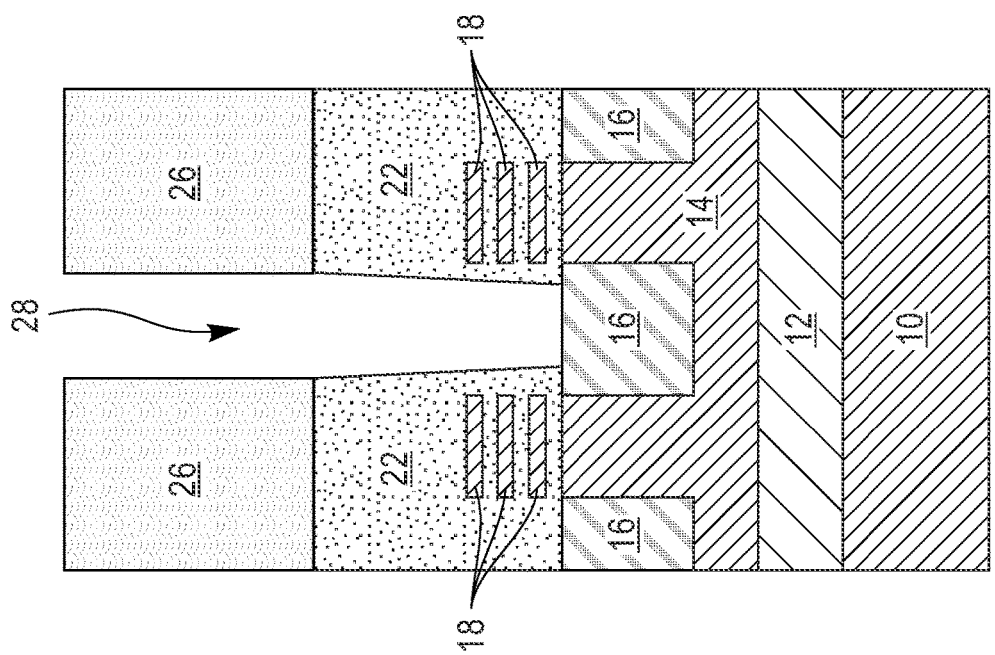

Referring now to FIGS. 2A-2D, there are illustrated the exemplary structure shown in FIGS. 1A-1D, respectively, after cutting each uncut functional gate structure 21 that is located between the two active device regions (i.e., the first active device region 100 and the second active device region 102) to provide a gate cut trench 28 located between the two active device regions (i.e., the first active device region 100 and the second active device region 102) and to provide cut functional gate structures 22 in each active device region (i.e., the first active device region 100 and the second active device region 102), wherein an end wall, E1, of the cut functional gate structures 22 in the various active device regions face each other, as shown in FIG. 2A. The facing end walls, E1, of the cut functional gate structures 22 are located in proximity to the gate cut trench 28. Gate cut trench 26 defines a gate cut region of the exemplary structure.

Figure 2C:
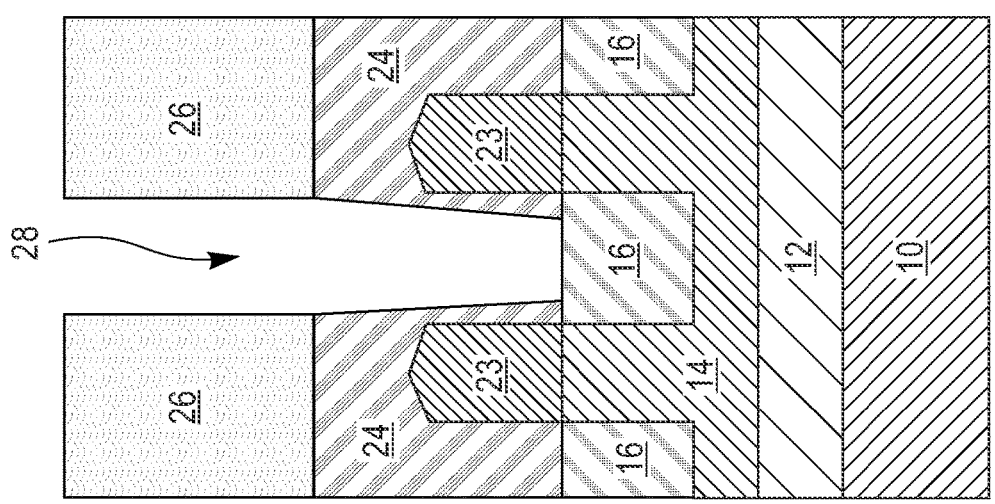

The exemplary structure shown in FIGS. 2A-2D is formed by first forming a patterned gate cut mask 26 having an opening that physically exposes the front side ILD material layer 24, a portion of the gate spacers 20 and a portion of the uncut functional gate structure 21 in the region between the first and second active device regions 100, 102 in which gate cutting is desired and the front side ILD material layer 24 that is located between the source/drain regions 23 of the uncut functional gate structures 21. The patterned gate cut mask 26 can be composed of a masking material such as, for example, an organic planarization layer (OPL). The patterned gate cut mask 26 can be formed by depositing the masking material, and then patterning the deposited masking material. An etch such as, for example, reactive ion etching (RIE), plasma etching or ion beam etching (IBE), can be used to remove the physically exposed material providing gate cut trench 28. Note that after this gate cutting process, the gate cut trench 28 physically exposes the shallow trench isolation layer 16 as is shown in FIGS. 2B and 2C.

Figure 3D:
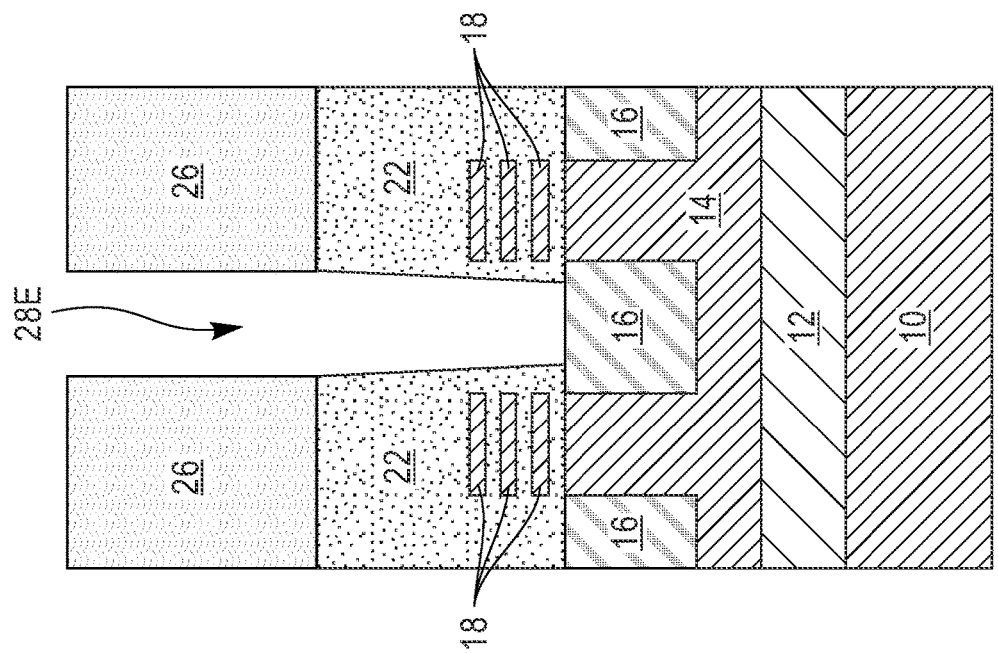
Figure 3C:
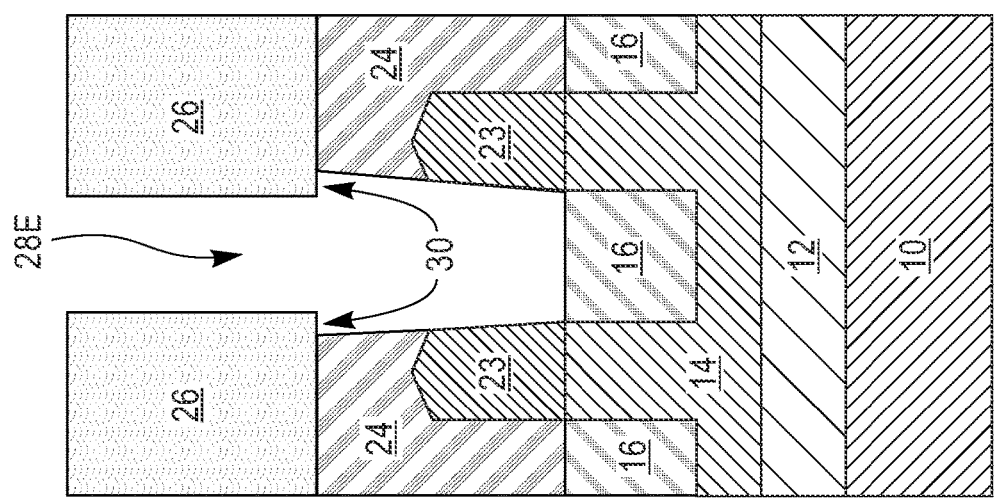
Figure 4B:
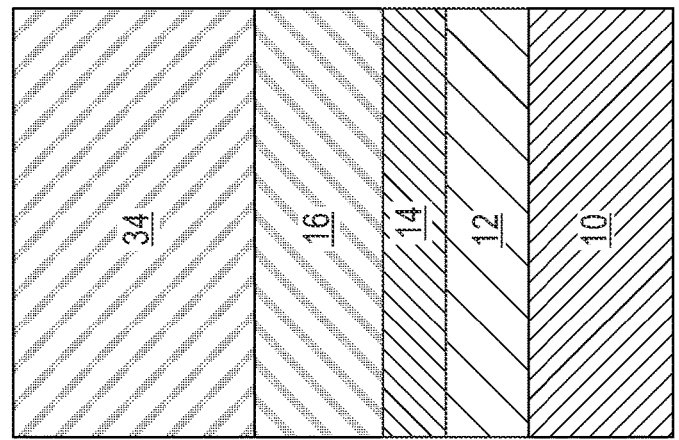
FIGS. 4A-4D are various views of the exemplary structure shown in FIGS. 3A-3D, respectively, after forming a bilayer dielectric material fill structure in the enlarged gate cut trench and on the physically exposed sidewalls of each cut functional gate structure.
Figure 4A:
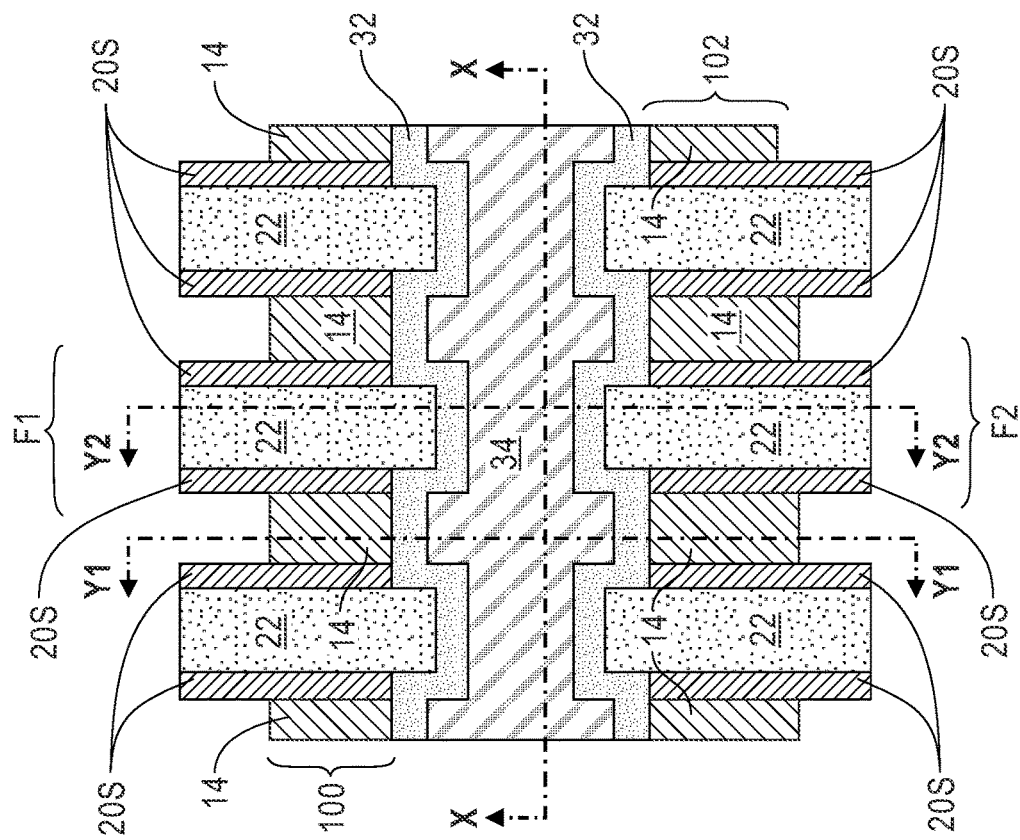
Figure 4D:
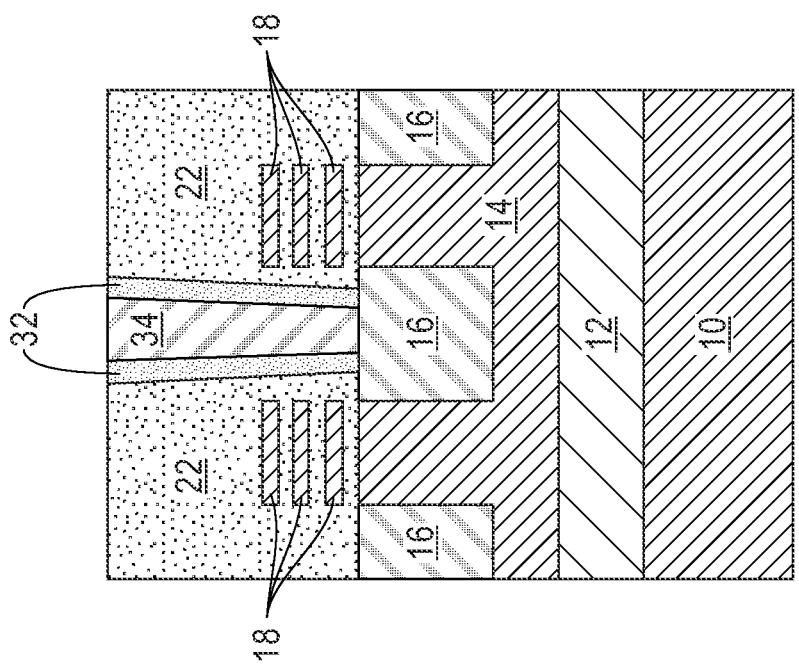
Figure 4C:
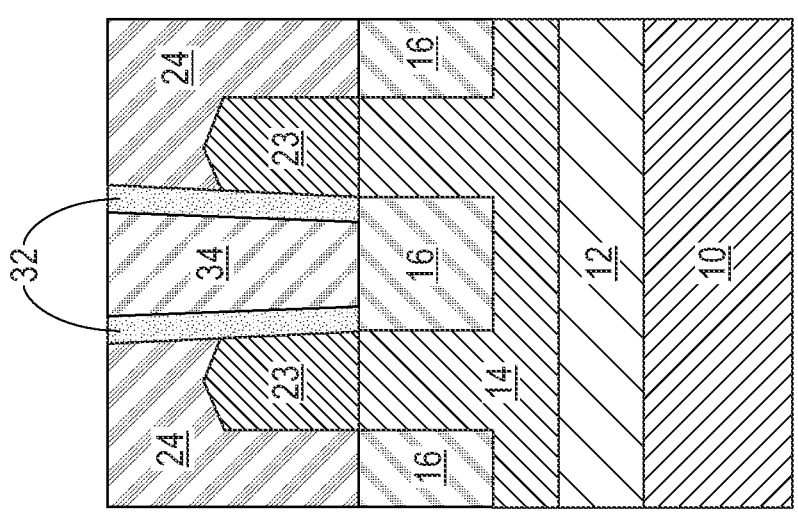

Referring now to FIGS. 3A-3D, there are illustrated the exemplary structure shown in FIGS. 2A-2D, respectively, after enlarging the width of gate cut trench 28 (providing enlarged gate cut trench 28E), and reducing the length of each gate spacer 20 to physically expose sidewalls of each cut functional gate structure 22 that are in proximity to the gate cut trench 28. The enlarging the width of the gate cut trench 28 includes a selective etching process that removes any front side ILD material layer 24 from facing sidewalls of the source/drain regions 23 that are present between the gate cut trench 28. This selective etch provides an overhang region 30 beneath the patterned masking layer 26 as is shown in FIG. 3C. The reducing the length of the gate spacer 20 includes a spacer etch that selectively removes a portion of the gate spacer 20 to provide reduced length gate spacers 20S. As is shown in FIG. 3A, the reduced length gate spacers 20S are not present on the entirety of the sidewalls of each cut functional gate structure 22. Thus, the sidewalls of the cut functional gate structures 22 which are in proximity to the gate cut trench 28 are now physically exposed. This enables the formation of an enlarge gate cut trench 28E Referring now to FIGS. 4A-4D, there is illustrated the exemplary structure shown in FIGS. 3A-3D, respectively, after forming a bilayer dielectric material fill structure 32/34 in the enlarged gate cut trench 28E and on the physically exposed sidewalls of each cut functional gate structure 22. Prior to forming the bilayer dielectric material fill structure 32/34, the patterned masking layer 26 can be removed from the exemplary structure utilizing a material removal process that is selective in removing the patterned masking layer 26. The bilayer dielectric material fill structure 32/34 provides electrical insulation in the structure.

The bilayer dielectric material fill structure 32/34 includes an outer dielectric material layer 32 located laterally adjacent to, and surrounding, an inner dielectric material layer 34. In the present application, the outer dielectric material layer 32 is composed of a first dielectric material that is compositionally different from a second dielectric material that provides the inner dielectric material layer 34. The first and second dielectric materials that provide the outer dielectric material layer 32 and the inner dielectric material layer 34, respectively, can include a silicon nitride based dielectric material such as, for example, silicon nitride, silicon boron carbon nitride, or a dielectric including atoms of Si, O, C and N, a silicon carbon based dielectric material such as, for example, silicon carbide or a dielectric including atoms of Si, C and O, or any other dielectric material such as, for example, silicon dioxide. In one example, outer dielectric material layer 32 is composed of a dielectric including atoms of Si, C and O or silicon carbide, and the inner dielectric material layer 34 is composed of silicon dioxide. The first and second dielectric materials are compositionally different from the front side ILD material layer 24.

The bilayer dielectric material fill structure 32/34 can be formed by first depositing a blanket layer of the first dielectric material in the enlarged gate cut trench 28E and on a topmost surface of the exemplary structure, a directional etch is then used to remove the blanket layer of the first dielectric material from all horizontal surfaces forming the outer dielectric material layer 32 as shown in the drawings. Note that the outer dielectric material layer 32 is a liner that is present on the sidewalls of the enlarged gate cut trench 28E. Next, a blanket layer of the second dielectric material is then deposited and thereafter a planarization process, such as, for example, chemical mechanical polishing (CMP) to remove the second dielectric material formed outside of the gate cut trench 28. The first and second depositing can include CVD, plasma enhanced chemical vapor deposition (PECVD), or atomic layer deposition (ALD). The remaining first dielectric material in the enlarged gate cut trench 28E provides the outer dielectric material layer 32, and the remaining second dielectric material in the enlarged gate cut trench 28E forms the inner dielectric material layer 34. The bilayer dielectric material fill structure 32/34 including the outer dielectric material layer 32 and the inner dielectric material layer 34 has a topmost surface that is coplanar with the at least each of the cut functional gate structures 22, as well as a topmost surface of the remaining front side ILD material layer 24.

Figure 5B:
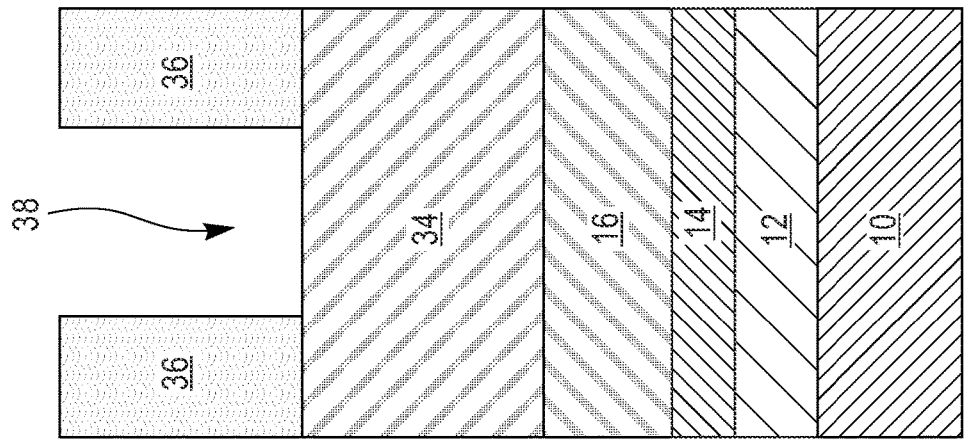
FIGS. 5A-5D are various views of the exemplary structure shown in FIGS. 4A-4D, respectively, after forming a patterned masking layer having an opening that physically exposes the bilayer dielectric material fill structure.
Figure 5A:
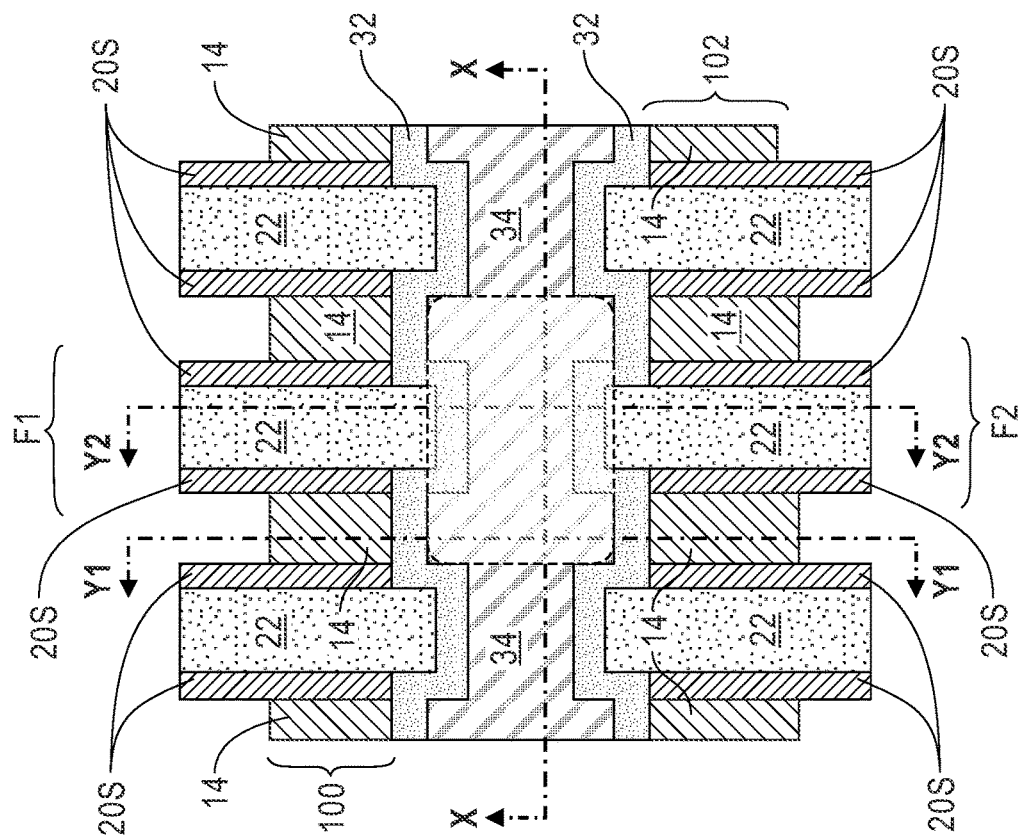
Figure 5D:
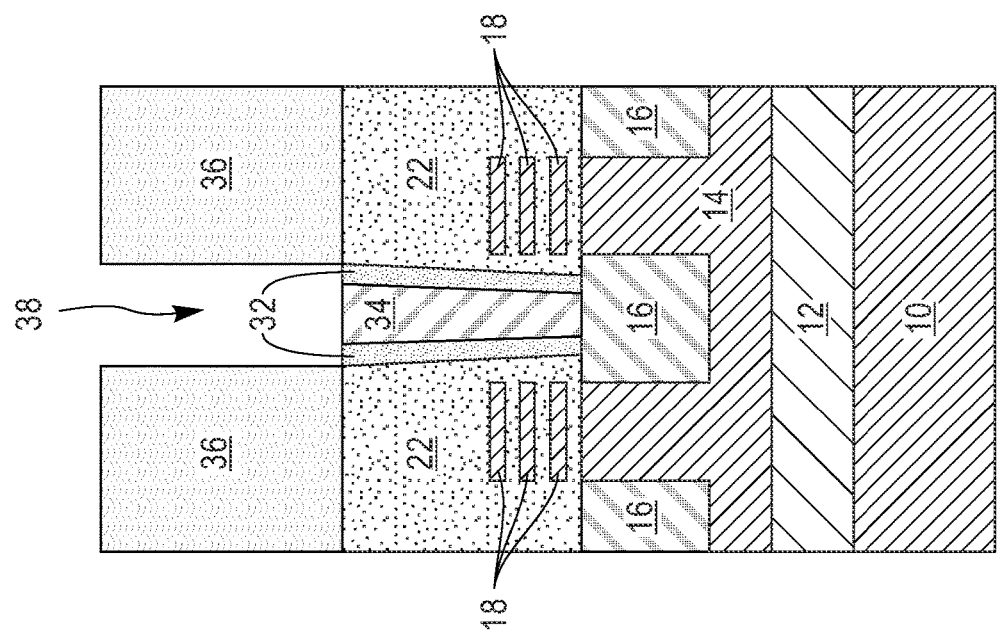
Figure 5C:
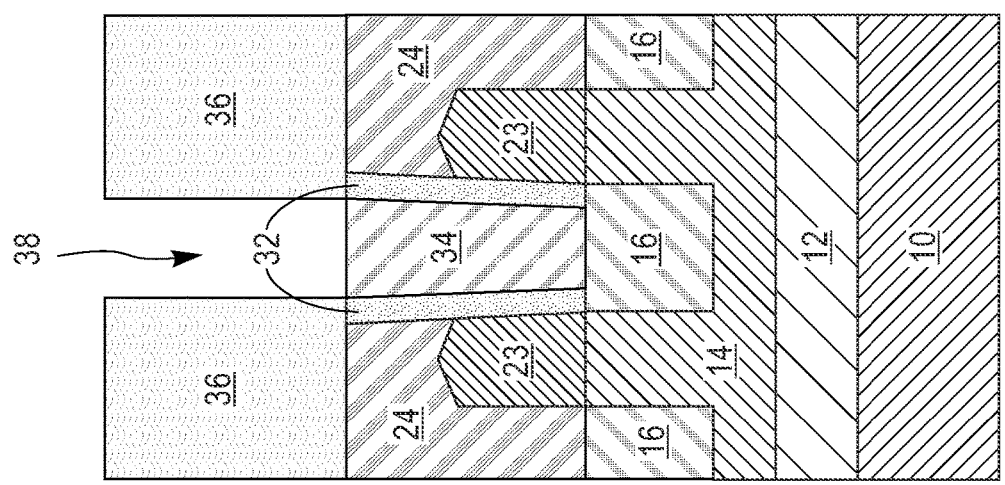
Figure 6B:
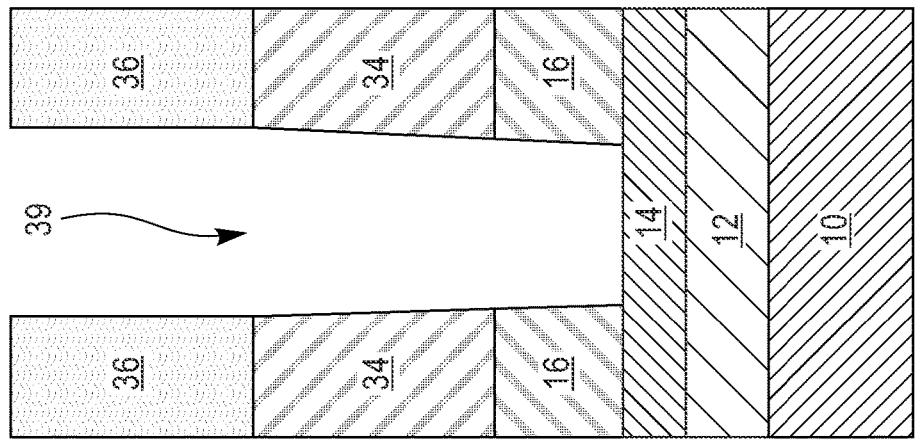
FIGS. 6A-6D are various views of the exemplary structure shown in FIGS. 5A-5D, respectively, after forming a VBPR trench in the gate cut region.
Figure 6A:
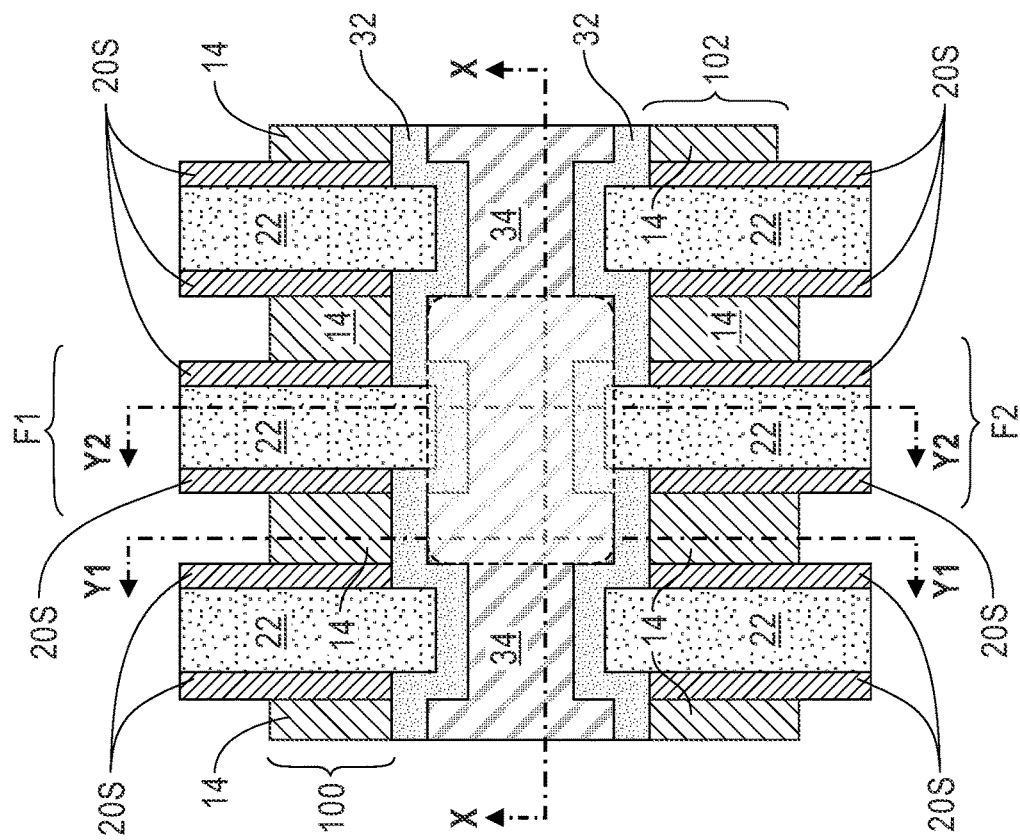
Figure 6D:
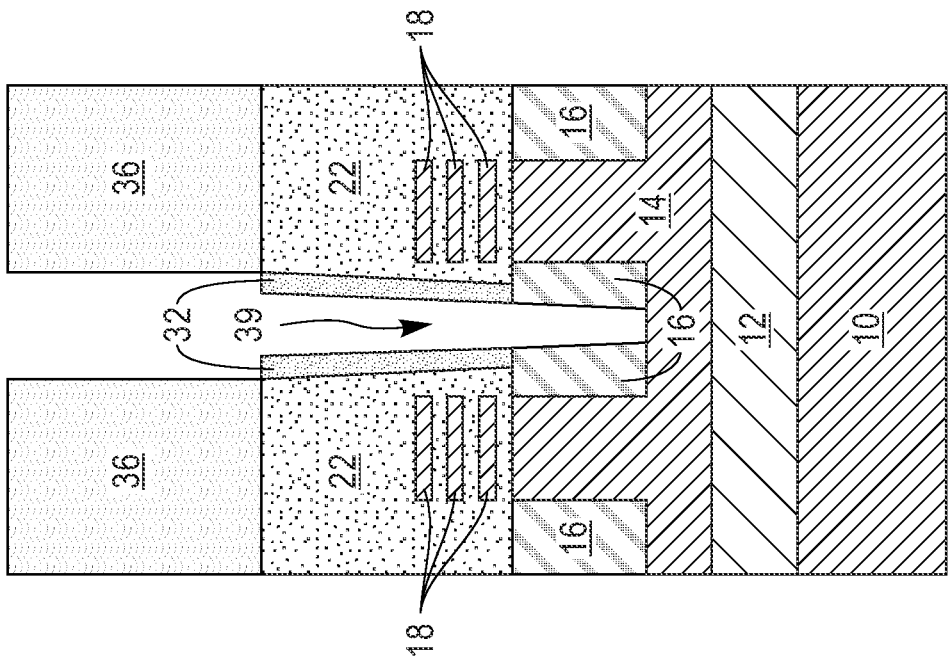
Figure 6C:
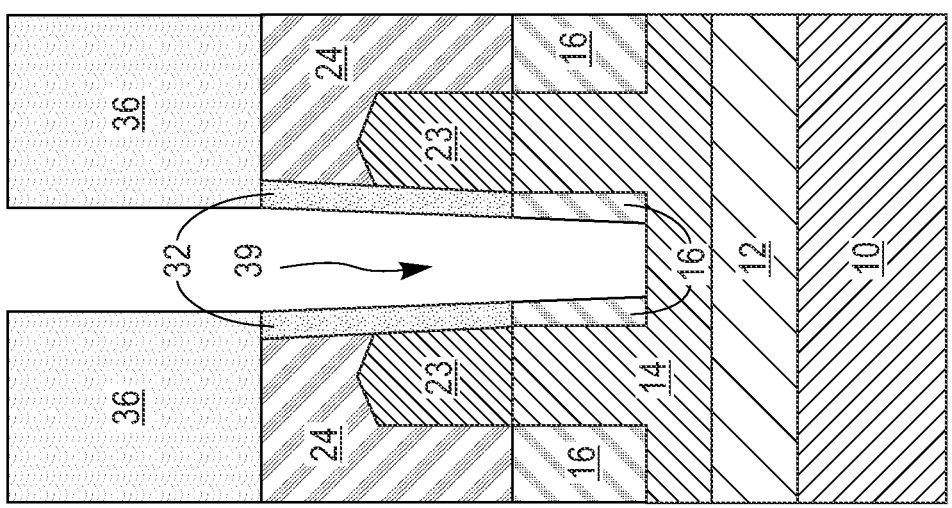

Referring now to FIGS. 5A-5D, there are illustrated the exemplary structure shown in FIGS. 4A-4D, respectively, after forming a patterned masking layer 36 having an opening 38 that physically exposes the bilayer dielectric material fill structure 32/34. The patterned masking layer 36 can be referred to as a VBPR patterned mask. The patterned masking layer 36 includes masking materials as mentioned above for the patterned gate cut mask 26. The patterned masking layer 36 can be formed utilizing the processing steps mentioned above in forming the patterned gate cut mask 26. In the Y1-Y1 cut as is shown in FIG. 5C, the opening 38 in the patterned masking layer 36 physically exposes the inner dielectric material layer 34 of the bilayer dielectric material fill structure 32/34; the inner dielectric material layer 34 in this region is at least partially protected, if not fully protected, by the patterned masking layer 36. In the Y2-Y2 cut as is shown in FIG. 5D, the opening 38 in the patterned masking layer 36 physically exposes both the inner dielectric material layer 34 and the outer dielectric material layer 32 of the bilayer dielectric material fill structure 32/34.

Referring now to FIGS. 6A-6D, there are illustrated the exemplary structure shown in FIGS. 5A-5D, respectively, after forming a VBPR trench 39 in the gate cut region. The VBPR trench 39 is formed by first removing the inner dielectric material layer 34 utilizing an etching process (such as, for example, a reactive ion etch) that is selective in removing the inner dielectric material layer 34. The patterned masking layer 36 is used as an etch mask during this selective etch. Another etch or the same selective etch can be used to remove the shallow trench dielectric structure 16 that is present beneath the inner dielectric material layer 34 so as to physically expose the second semiconductor layer 14 of the semiconductor substrate. The patterned masking layer 36 is used as an etch mask during the etch that removes the shallow trench isolation structure 16 that is present beneath the inner dielectric material layer 34.

Figure 7B:
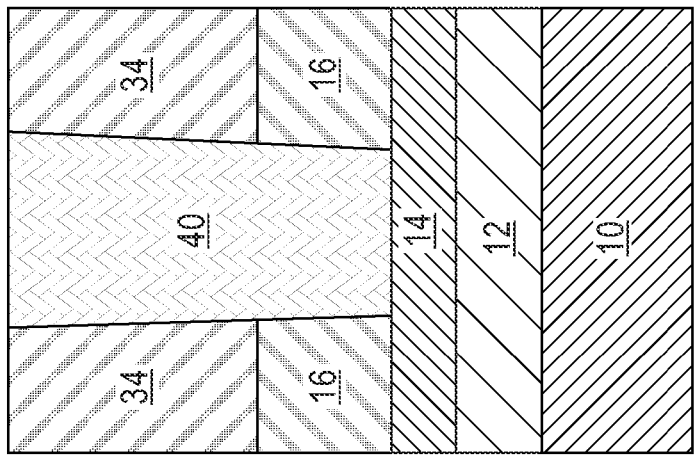
FIGS. 7A-7D are various views of the exemplary structure shown in FIGS. 6A-6D, respectively, after removing the patterned masking layer, forming source/drain contact openings, and filling the VBPR trench and each source/drain contact opening with at least a contact conductor material.
Figure 7A:
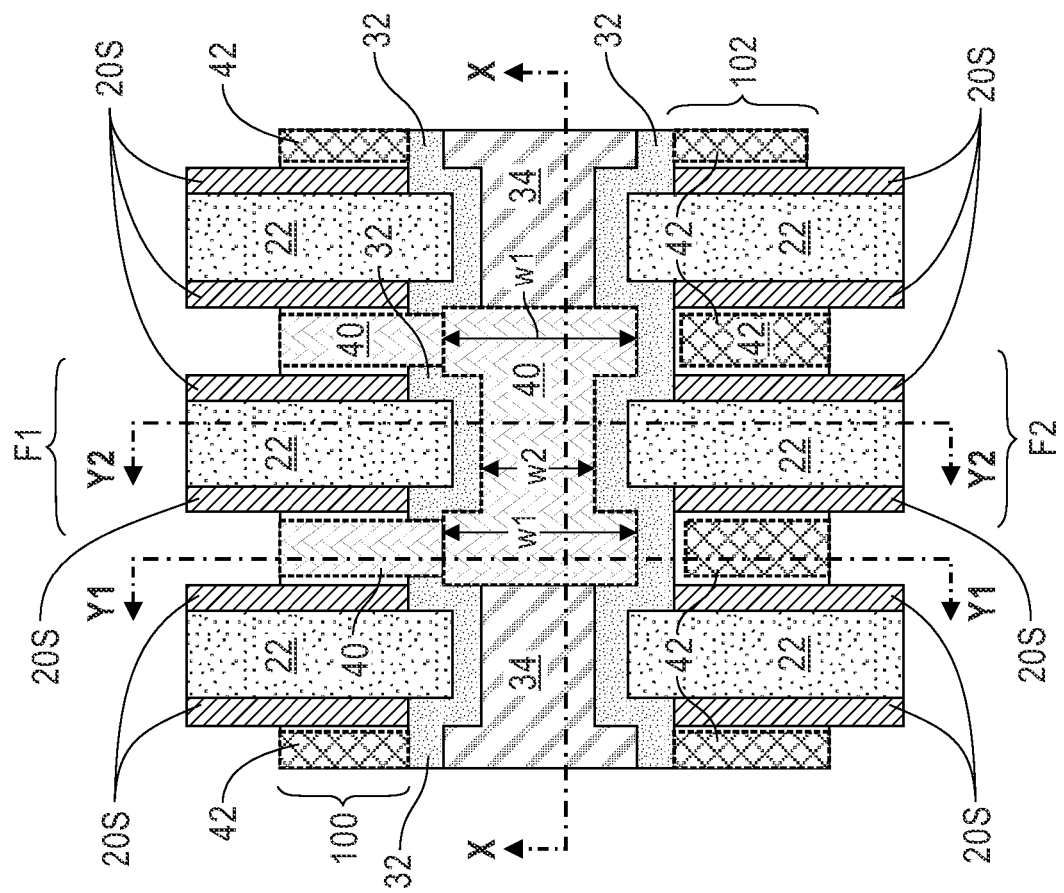
Figure 7C:
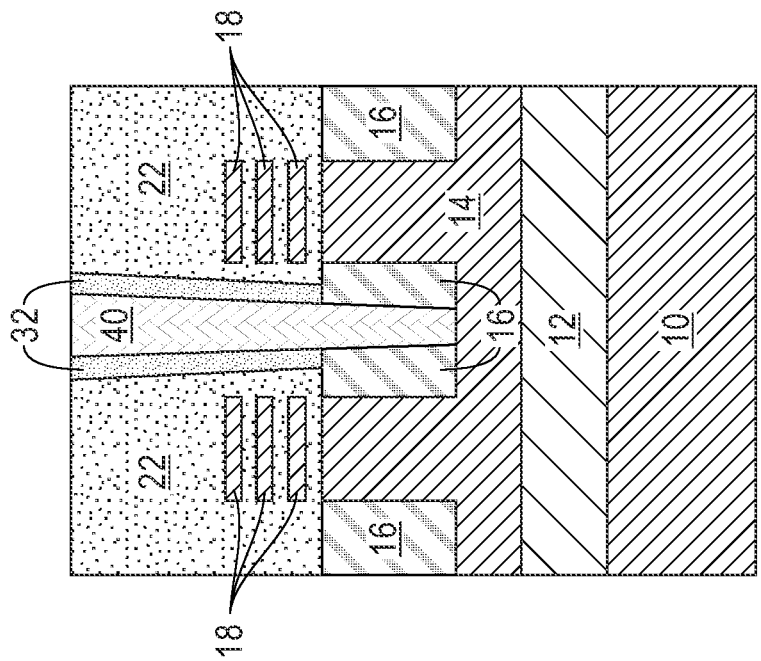
Figure 7D:
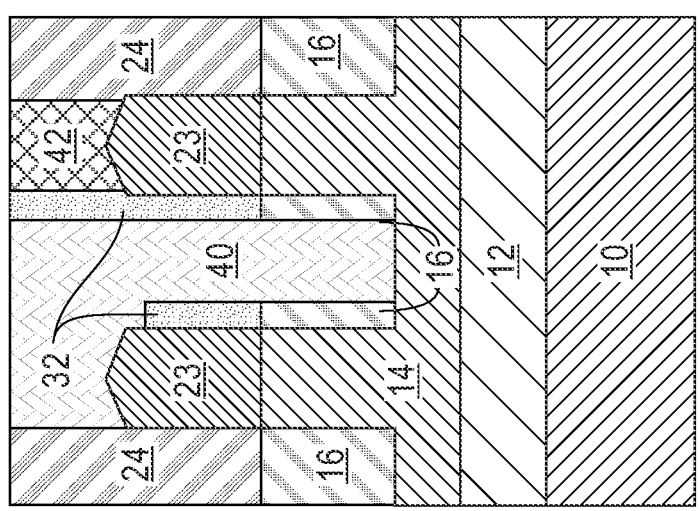
Figure 9B:
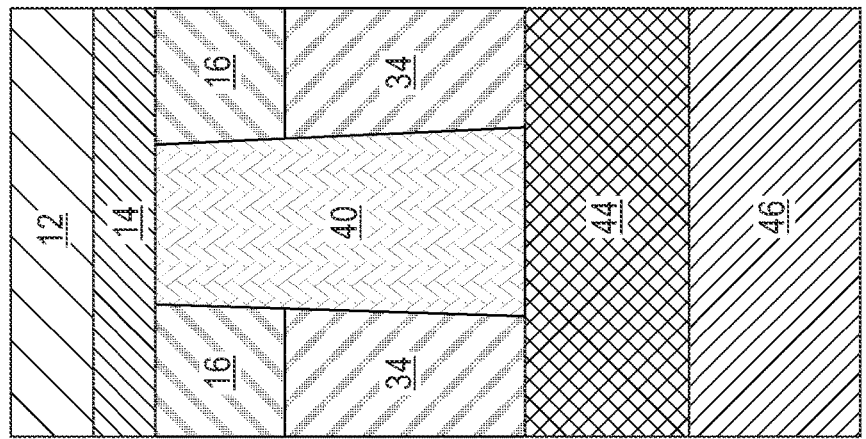
FIGS. 9A-9D are various views of the exemplary structure shown in FIGS. 8A-8D, respectively, after wafer flipping and removing a first semiconductor material layer of the semiconductor substrate so as to physically expose an etch stop layer of the semiconductor substrate.
Figure 9A:
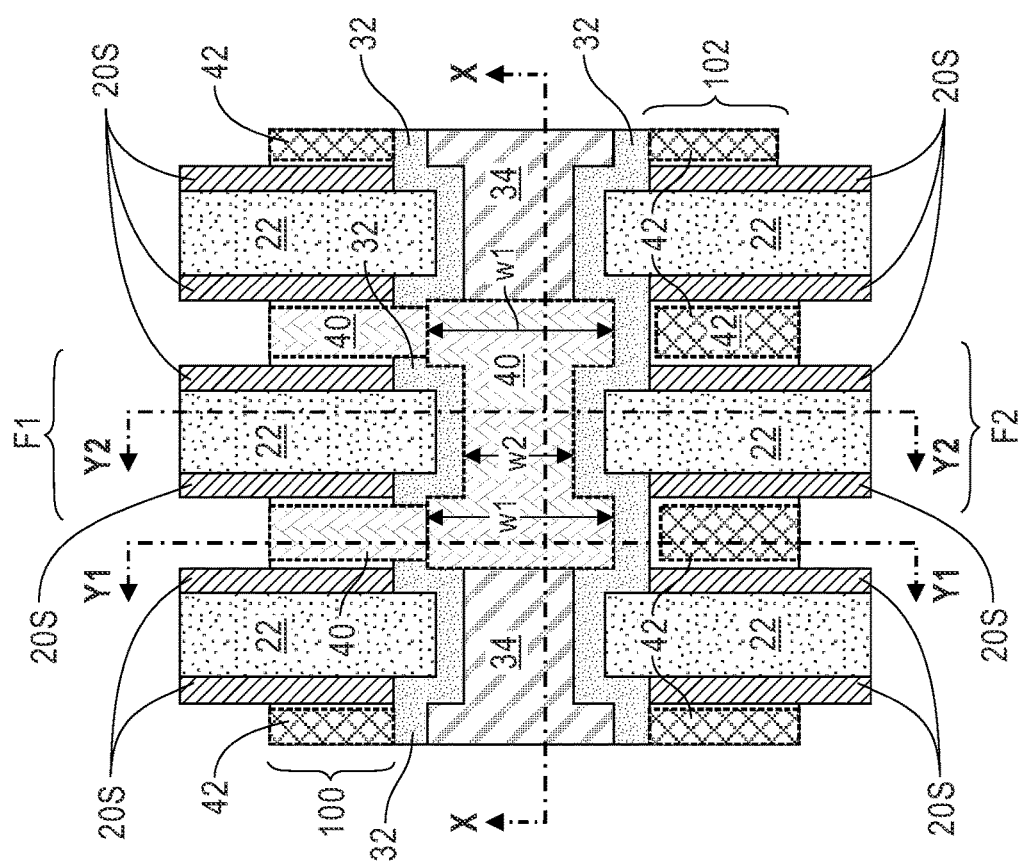
Figure 9D:
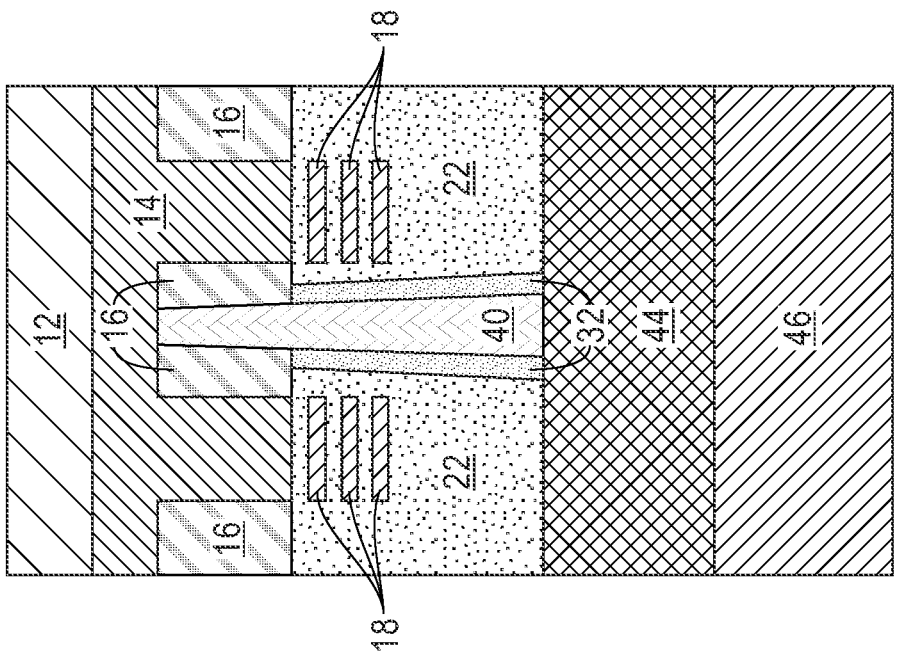
Figure 9C:
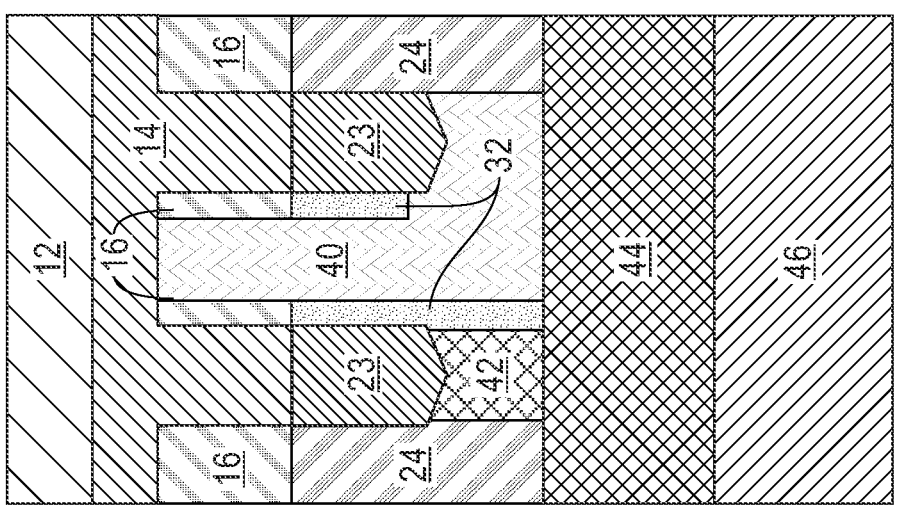
Figure 10B:
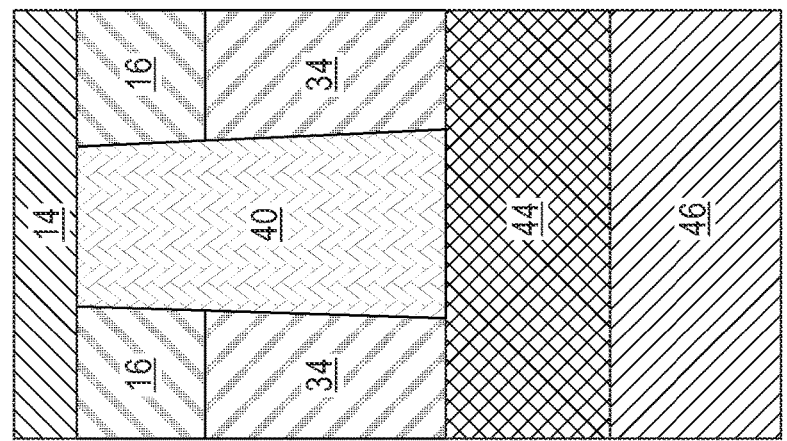
FIGS. 10A-10D are various views of the exemplary structure shown in FIGS. 9A-9D, respectively, after removing the etch stop layer to physically expose a second semiconductor material layer of the semiconductor substrate.
Figure 10A:
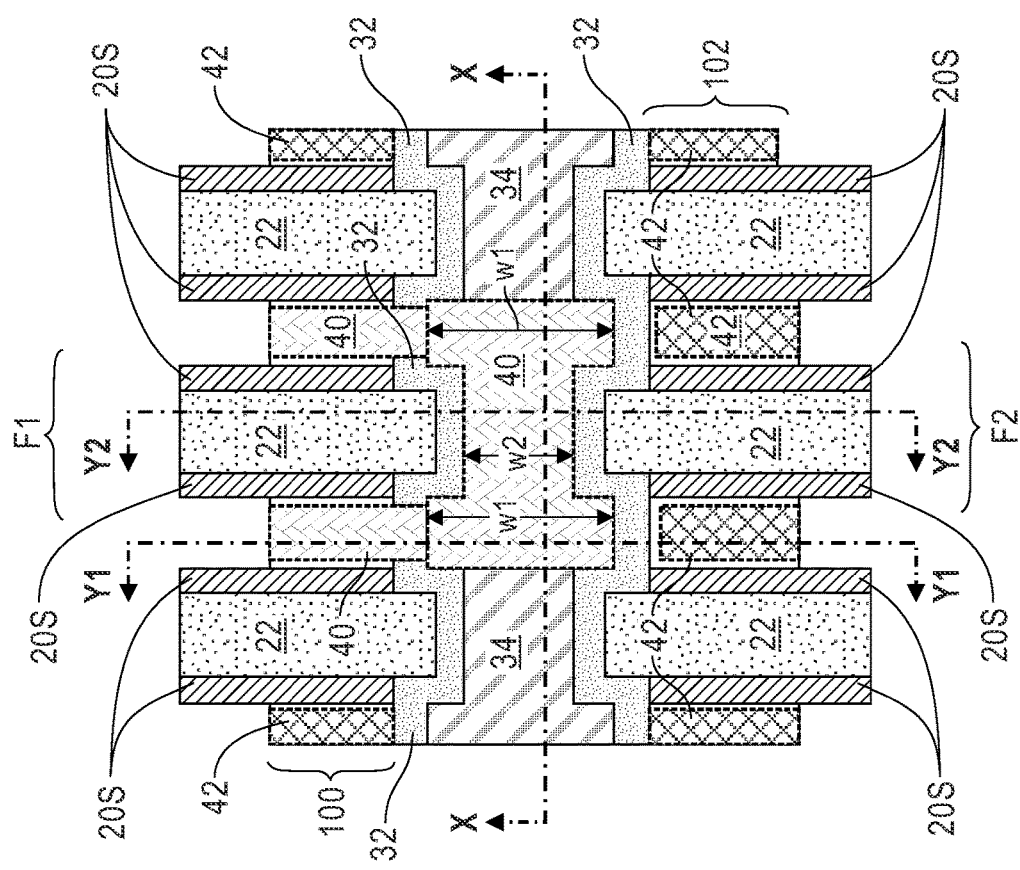
Figure 10D:
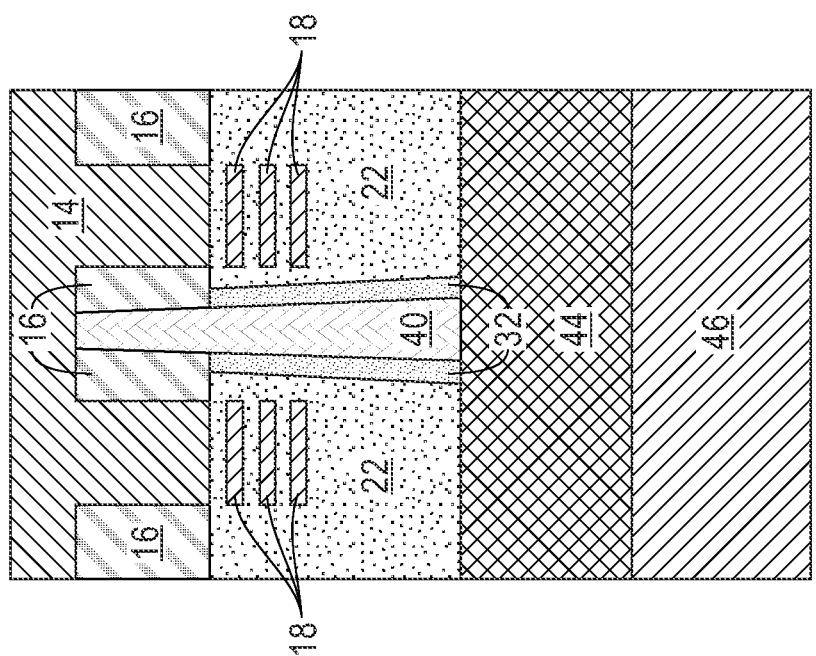
Figure 10C:
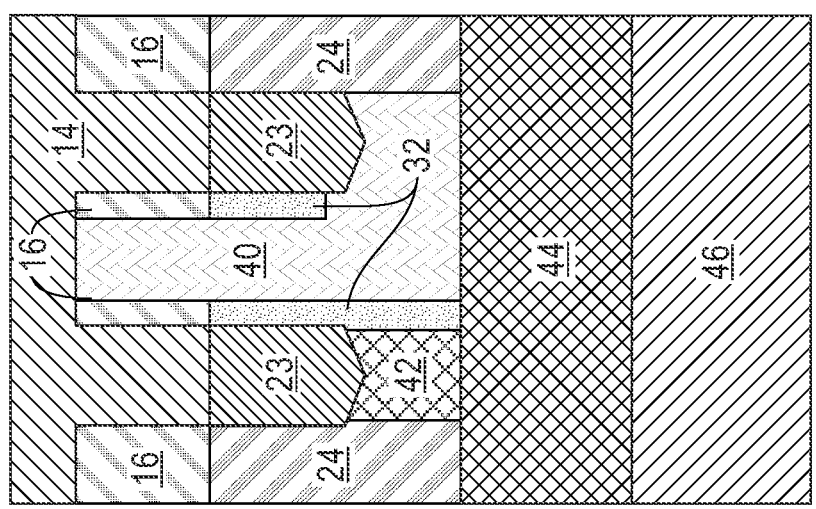

Referring now to FIGS. 7A-7D, there are illustrated the exemplary structure shown in FIGS. 6A-6D, respectively, after removing the patterned masking layer 36, forming source/drain contact openings (not specifically shown), and filling the VBPR trench 39 and each source/drain contact opening with at least a contact conductor material. It is noted that in the present application, a source/drain contact opening is formed in communication with the VBPR trench 39 so as to allow the formation of a combined source/drain contact opening/VBPR trench that will subsequently be filled with at least a contact conductor material. In accordance with the present application, the at least contact conductor material filled combined source/drain contact opening/VBPR trench provide a VBPR contact structure 40 which at this point of the present has a surface that contacts one of the source/drain region 23 of one of the FETs (See, for example, FIG. 7C). The at least contact material filled source/drain contact openings provide front side source/drain contact structure 42 as is shown in FIG. 7C.

As stated above, the VBPR contact structure 40 and the front side source/drain contact structure 42 include at least a contact conductor material. An optional contact liner can be present on a sidewall and bottommost surface of the VBPR contact structure 40 and the front side source/drain contact structures 42. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The contact conductor material can be formed by any suitable deposition method such as, for example, ALD, CVD, physical vapor deposition (PVD) or plating. The VBPR contact structure 40 and the front side source/drain contact structure 42 can be formed by forming contact openings in the front side ILD material layer 34; these contact openings physically expose the source/drain regions 23. Each contact opening and the combined source/drain contact opening/VBPR trench are then filled with a contact conductor material, and then planarized to remove any contact conductor material that is located outside the contact openings as well as the combined source/drain contact opening/VBPR trench.

The front side source/drain contact structures 42 and the VBPR contact structure 40 can include one or more contact liners (not shown) formed along sidewalls of contact openings and combined contact opening/VBPR trench prior to forming front side source/drain contact structures 42 and the VBPR contact structure 40. In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed.

In one or more embodiments in which a contact liner is present, the contact liner (not shown) can include a silicide liner, such as Ti, Ni, NiPt, etc., and a diffusion barrier material. Exemplary diffusion barrier materials include, but are not limited to, Ru, TiN, TaN, WN, WC, an alloy thereof, or a stack thereof such as Ti/TiN and Ti/WC. The contact liner can be formed utilizing a conformal deposition process including PVD, CVD or ALD. The contact liner that is formed can have a thickness ranging from 1 nm to 8 nm, although lesser and greater thicknesses can also be employed.

As is shown in FIG. 7A, the VBPR contact structure 40 has a first width, W1, in an area between the first source/drain region 23 of a first FET and a first source/drain region 23 of a second FET and between the second source/drain region 23 of the first FET and a second source/drain region of the second FET, and a second width, W2, in area between ends of the functional gate structure 22 of the first FET and the functional gate structure of the second FET, wherein the first width is larger than the second width. This enlarged VBPR contact structure 40 provides enhanced properties to the resultant structure.

Referring now to FIGS. 8A-8D, there are illustrated the exemplary structure shown in FIGS. 7A-7D, respectively, after forming a front side BEOL structure 44 and a carrier wafer 46. The front side BEOL structure 44 includes one or more interconnect dielectric material layers that contain one or more wiring regions embedded thereon. The front side BEOL structure 44 can be formed utilizing BEOL processing techniques that are well known to those skilled in the art. As is shown in FIGS. 8B-8D, the front side BEOL contact structure 44 contacts the VBPR contact structure 40. The carrier wafer 46 can include one of the semiconductor materials mentioned above for the first semiconductor material layer 10. In the present application, the carrier wafer 46 is bonded to the front side BEOL structure 44.

Referring now to FIGS. 9A-9D, there are shown the exemplary structure shown in FIGS. 8A-8D, respectively, after wafer flipping and removing a first semiconductor material layer 10 of the semiconductor substrate so as to physically expose the etch stop layer 12 of the semiconductor substrate. The flipping will allow back side processing of the exemplary structure. In the present application, the structure is flipped 180° (note that the top down view shown in FIG. 8A as well as FIGS. 9A, 10A, 11A, 12A and 13A) is not flipped so as to continue to illustrate the device layout of the structure. Flipping of the structure can be performed by hand or by utilizing a mechanical means such as, for example, a robot arm. The removal of the first semiconductor material layer 10 can be performed utilizing a material removal process that is selective in removing the semiconductor material that provides the first semiconductor material layer 10.

Referring now to FIGS. 10A-10D, there are illustrated the exemplary structure shown in FIGS. 9A-9D, respectively, after removing the etch stop layer 12 to physically expose the second semiconductor material layer 14 of the semiconductor substrate. The removal of the etch stop layer 12 includes a material removal process that is selective in removing the etch stop layer 12.

Figure 11B:
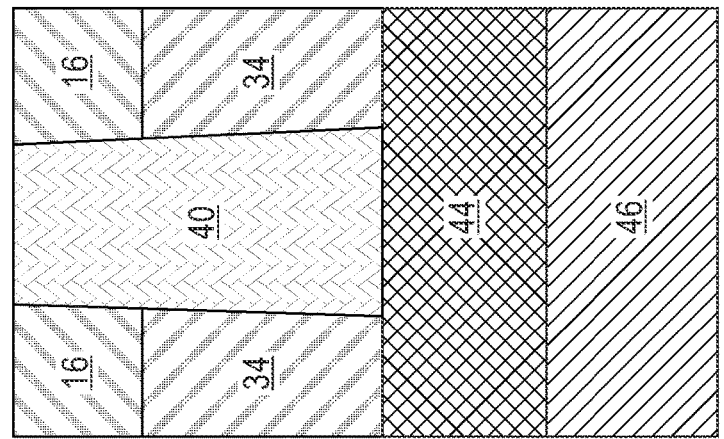
FIGS. 11A-11D are various views of the exemplary structure shown in FIGS. 10A-10D, respectively, after recessing the second semiconductor material layer of the semiconductor substrate.
Figure 11A:
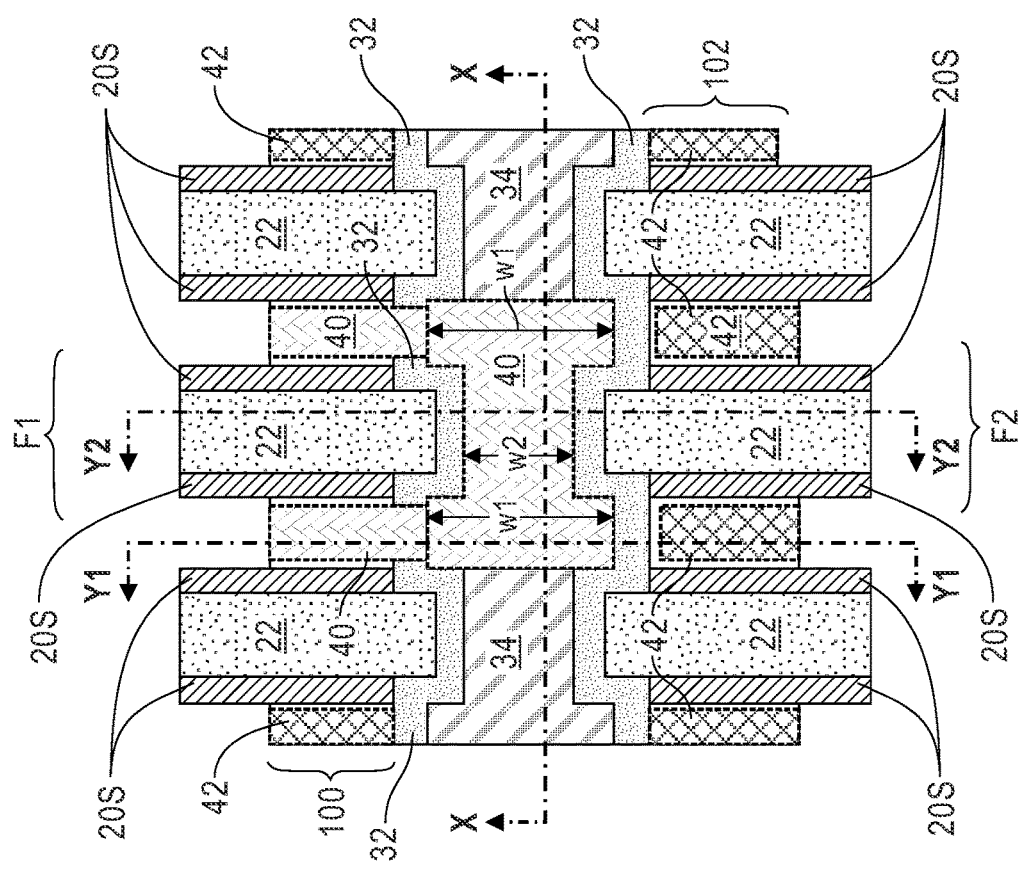
Figure 11D:
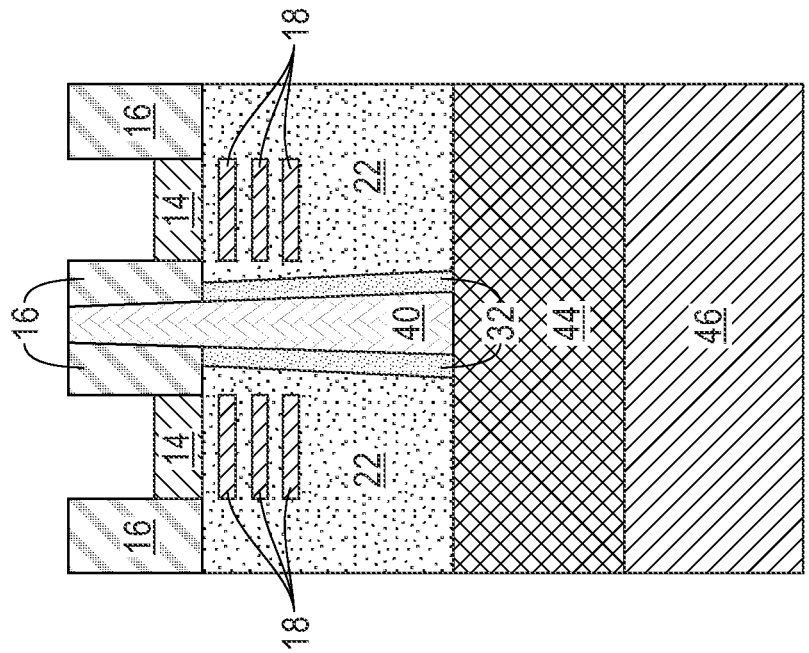
Figure 11C:
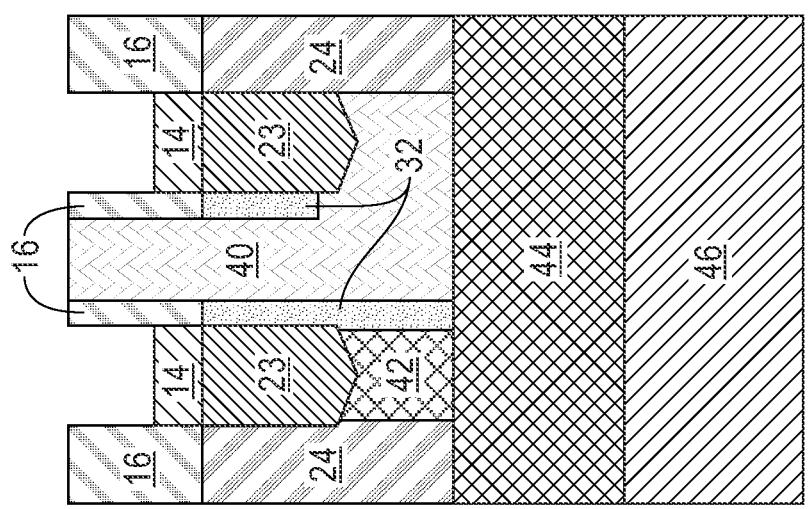
Figure 12A:
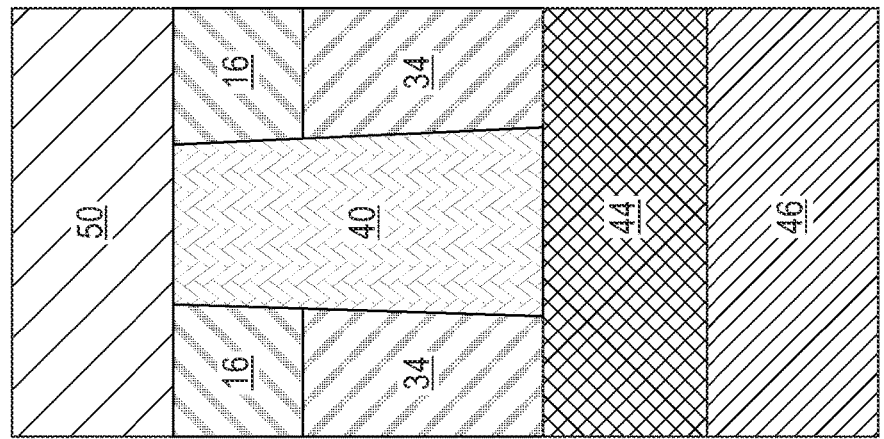
Figure 12A:
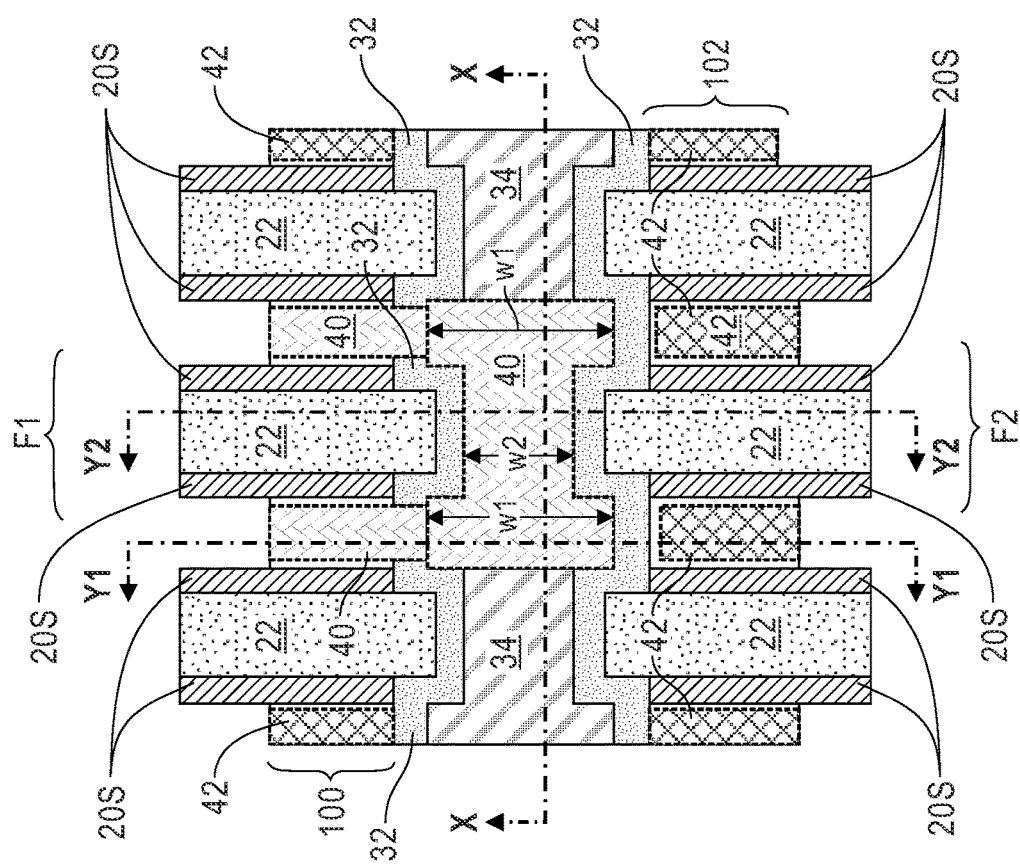
Figure 12D:
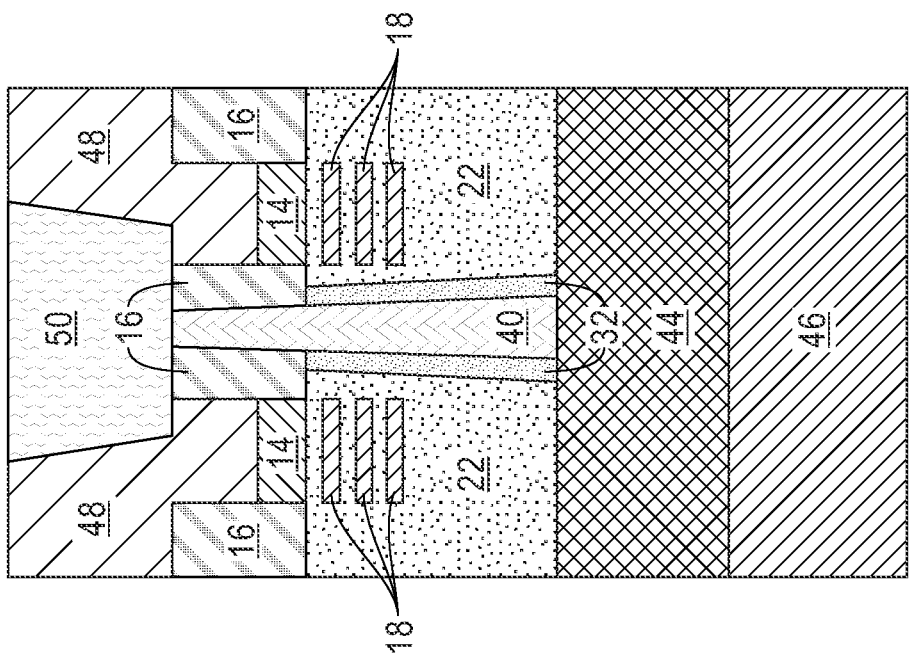
Figure 12C:
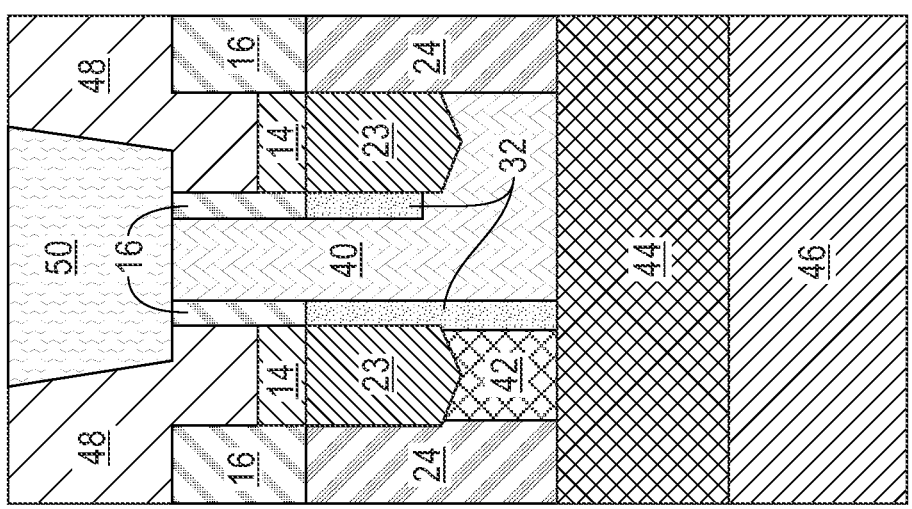

Referring now to FIGS. 11A-11D, there are illustrated are various views of the exemplary structure shown in FIGS. 10A-10D, respectively, after recessing the second semiconductor material layer 14 of the semiconductor substrate. The recessing of the second semiconductor material layer 14 includes a material removal process that is selective in removing the second semiconductor material layer 14. A portion of the second semiconductor material layer 14 remains in contact with a surface of the source/drain regions 23 and in contact along the sidewalls with the shallow trench isolation structure 16 as is shown in FIG. 11C.

Referring now to FIGS. 12A-12D, there are shown the exemplary structure shown in FIGS. 11A-11D, respectively, after forming a backside ILD material layer 48 and forming a backside power rail 50 in the backside ILD material layer 48. The back side ILD material layer 48 includes one of the dielectric materials mentioned above for the front side ILD material layer 24. The back side ILD material layer 48 can be formed utilizing a deposition process such as, for example, CVD, PECVD, ALD, or spin-on coating.

The backside power rail 50 is composed of any electrically conductive power rail material including, but not limited to, tungsten (W), cobalt (Co), ruthenium (Ru), aluminum (Al), copper (Cu), platinum (Pt), rhodium (Rh), or palladium (Pd), with a thin metal adhesion layer (such as TiN, TaN) typically being formed prior to the conductive metal deposition; for clarity, the metal adhesion layer is not separately illustrated in the drawings of the present application. The backside power rail 50 can be formed by forming a backside power rail opening in the backside ILD material layer; the backside power rail opening physically exposes a surface of at least the VBPR contact structure 40. The backside power rail opening is then filled with at least one of the electrically conductive power rail materials mentioned above, and a planarization process can follow the filling of the backside power rail opening. The filling can include a CVD, PECVD, ALD, sputtering or plating.

Referring now to FIGS. 13A-13D, there are shown the exemplary structure shown in FIGS. 12A-12D, respectively, after forming a backside power distribution network 52. The backside power distribution network 52 is formed on top of the backside ILD material layer 48 that includes the backside power rail 50 embedded therein. Thus, the backside power distribution network 52 contacts the backside power rail 50. The backside power distribution network 52 includes elements/components that configured to distribute power to the FETs.

Figure 13B:
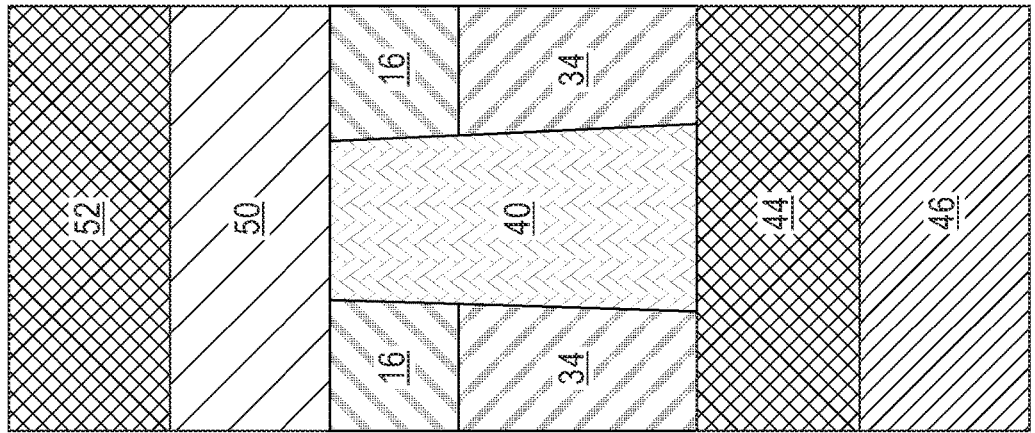
FIGS. 13A-13D are various views of the exemplary structure shown in FIGS. 12A-12D, respectively, after forming a backside power distribution network.
Figure 13A:
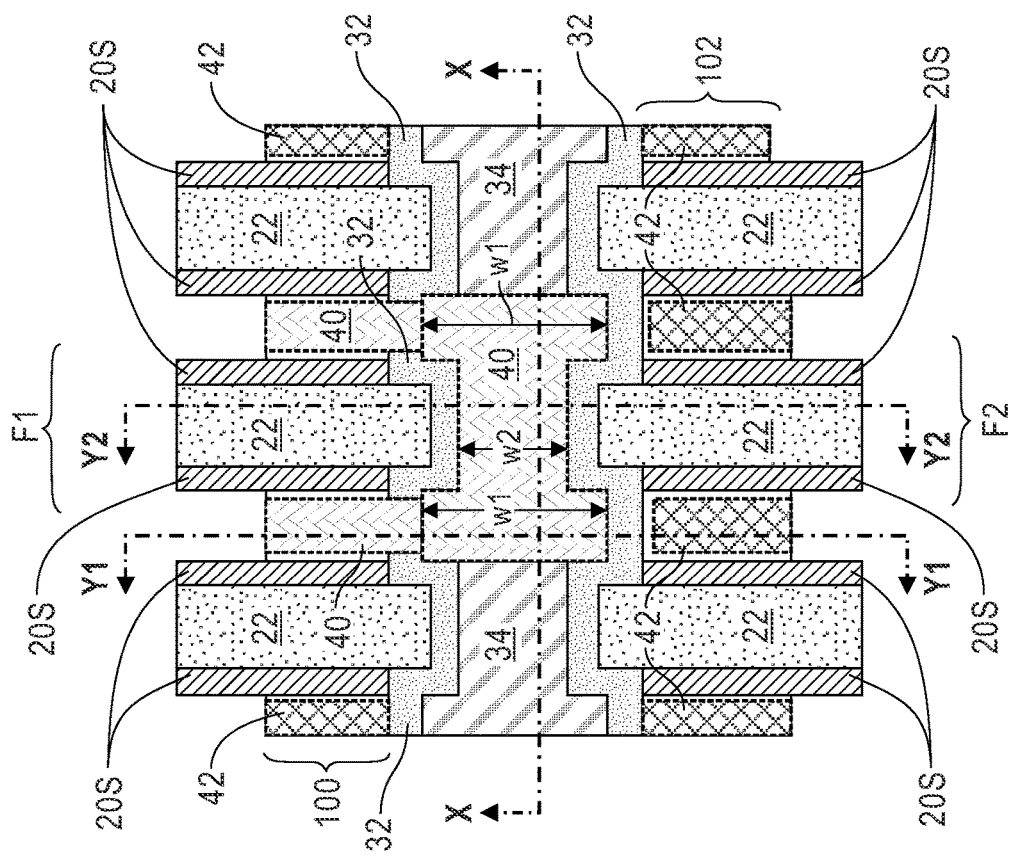
Figure 13D:
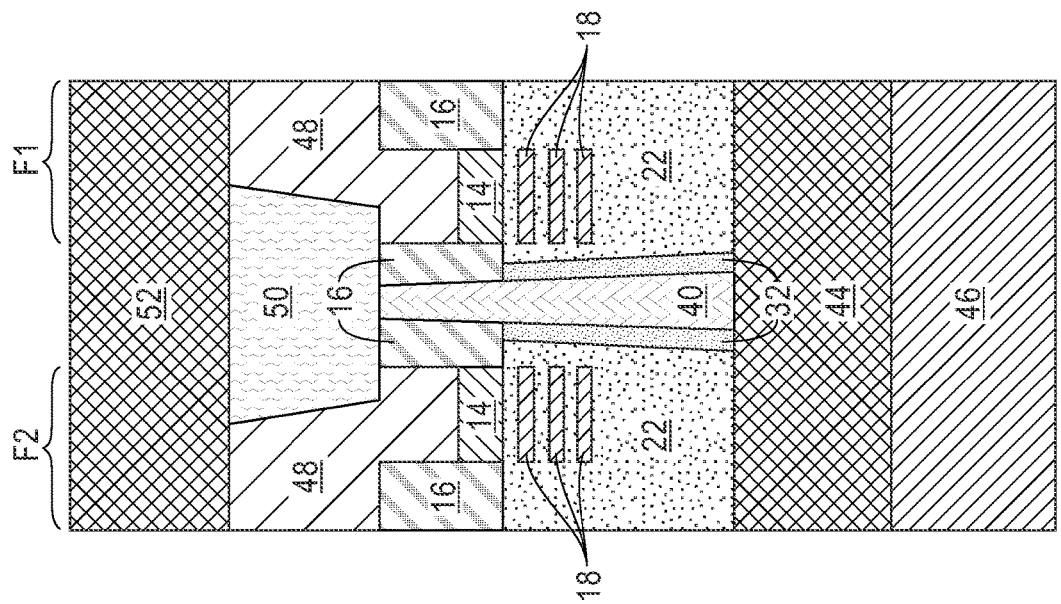
Figure 13C:
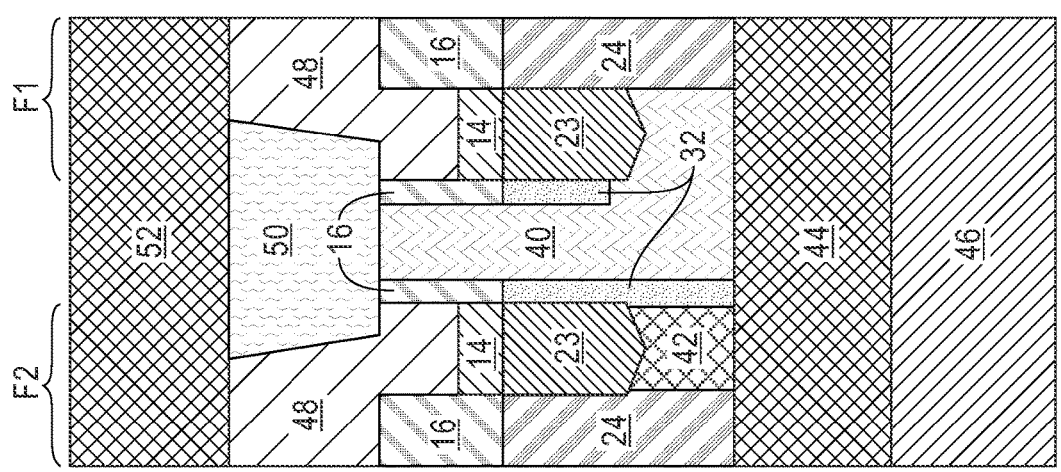

Notably, FIGS. 13A-13D illustrates an exemplary structure of the present application. This exemplary structure includes a first active device region 100 including a first FET, F1, having a first source/drain region 23 and a second source/drain region (not shown), and a second active device region 102 located adjacent to the first active device region 100 and including a second FET, F2. An end wall of the functional gate structure 22 of F1 faces an end wall of the functional gut structure of F2. A gate cut region is located between F1 and F2 and VBPR contact structure 40 is present in the gate cut region. In the present application, the VBPR contact structure 40 contacts backside power rail 50 and the first source/drain region 23 of F1. As is shown in FIG. 13A, the VBPR contact structure 40 extends from the first source/drain region 23 to a second source/drain region of F1 through the gate cut region. As mentioned above, the gate cut region includes bi-layer dielectric fill structure 32/34 including inner dielectric material layer 32 and outer dielectric material layer 34. In the present application, and as is shown in FIG. 13A, the outer dielectric material layer 32 is present around the end walls of the functional gate structurer 22 of both F1 and F2, as well as along sidewalls of the sources drain regions 23. This provides electrically insulation to the structure. As shown in FIGS. 13A and 13C, front side source/drain contact structure 42 contacts each of the first source/drain region 23 of F2 and second source/drain region 23 of the F2, wherein the outer dielectric material layer 32 is present between the front side source/drain contact structure 42 and the VBPR contact structure 40. As mentioned above, front side BEOL structure 44 contacts at least the VBPR contact structure 40, and carrier wafer 46 contacts the front side BEOL structure 44. As is also shown, backside power distribution network 52 is present that contacts both the backside ILD material layer 48 and the backside power rail 50. In the present application, and as further shown shallow trench isolation structure 16 laterally surrounding a portion of the VBPR contact structure 40. In accordance with the present application, and as is shown in the drawings, the VBPR contact structure is entirely spaced apart from F2 by the outer dielectric material layer 32 of the bi-layer dielectric fill structure 32/34 that is present in the gate cut region. In the present application, and as is illustrated in FIG. 13A, the sidewalls of functional gate structure 22 of F1 are aligned to sidewalls of the functional gate structure 22 of F2, and as is illustrated in FIG. 13C, a sidewall of the first source/drain region 23 of F1 is spaced apart from the VBPR contact structure 40 by the outer dielectric material layer 32 of the bilayer dielectric fill structure 32/34 that is present in the gate cut region.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first active device region comprising a first field effect transistor (FET) having a first source/drain region and a second source/drain region;
a second active device region located adjacent to the first active device region and comprising a second FET, wherein an end wall of a functional gate structure of the first FET faces an end wall of a functional gate structure of the second FET;
a gate cut region located between the first FET and the second FET; and
a via-to-backside power rail (VBPR) contact structure located in the gate cut region that is located between the first FET and the second FET, wherein the VBPR contact structure contacts a backside power rail and the first source/drain region of the first FET, extends from the first source/drain region to the second source/drain region of the first FET through the gate cut region, and has a first width in an area between the first source/drain region of the first FET and a first source/drain region of the second FET and between the second source/drain region of the first FET and a second source/drain region of the second FET, and a second width in area between the end wall of the functional gate structure of the first FET and the end wall of the functional gate structure of the second FET, wherein the first width is larger than the second width.

2. The semiconductor structure of claim 1, wherein the gate cut region comprises a bi-layer dielectric fill structure comprising an inner dielectric material layer and an outer dielectric material layer.

3. The semiconductor structure of claim 2, wherein the outer dielectric material layer is present around the end wall of the functional gate structure of both the first FET and the second FET.

4. The semiconductor structure of claim 2, further comprising a front side source/drain contact structure contacting each of a first source/drain region of the second FET and a second source/drain region of the second FET, wherein the outer dielectric material layer is present between the front side source/drain contact structure and the VBPR contact structure.

5. The semiconductor structure of claim 1, further comprising a front side back-end-of-the-line (BEOL) structure contacting at least the VBPR contact structure.

6. The semiconductor structure of claim 5, further comprising a carrier wafer located on the front side BEOL structure.

7. The semiconductor structure of claim 1, wherein the backside power rail is located in a backside interlayer dielectric (ILD) material layer.

8. The semiconductor structure of claim 7, further comprising a backside power distribution network contacting both the backside ILD material layer and the backside power rail.

9. The semiconductor structure of claim 1, further comprising a shallow trench isolation structure laterally surrounding a portion of the VBPR contact structure.

10. The semiconductor structure of claim 9, wherein the shallow trench isolation structure contacts a surface of the backside power rail.

11. The semiconductor structure of claim 1, wherein the VBPR contact structure has a surface opposite a surface that contacts the backside power rail that is coplanar with a surface of both the first FET and the second FET.

12. The semiconductor structure of claim 1, wherein each of the first FET and the second FET comprises a nanosheet-containing FET.

13. The semiconductor structure of claim 12, wherein the nanosheet-containing FET comprises the functional gate structure of the first FET and the second FET wrapping around a plurality of vertically stacked semiconductor channel material nanosheets.

14. The semiconductor structure of claim 13, further comprising a gate spacer located laterally adjacent the functional gate structure of the first FET and the second FET, wherein the gate spacer is absent from a portion of a sidewall of the functional gate structure of the first FET and the second FET that is in proximity to the gate cut region.

15. The semiconductor structure of claim 14, wherein the plurality of vertically stacked semiconductor channel material nanosheets are spaced apart from a semiconductor material layer.

16. The semiconductor structure of claim 1, wherein the VBPR contact structure is entirely spaced apart from the second FET present in the second active device region by an outer dielectric material layer of a bi-layer dielectric fill structure that is present in the gate cut region.

17. The semiconductor structure of claim 1, wherein sidewalls of the functional gate structure of the first FET are aligned to sidewalls of the functional gate structure of the second FET.

18. The semiconductor structure of claim 1, wherein a sidewall of the first source/drain region of the first FET is spaced apart from the VBPR contact structure by an outer dielectric material layer of a bilayer dielectric fill structure that is present in the gate cut region.

19. A semiconductor structure comprising:
a first active device region comprising a first field effect transistor (FET) having a first source/drain region and a second source/drain region;
a second active device region located adjacent to the first active device region and comprising a second FET, wherein an end wall of a functional gate structure of the first FET faces an end wall of a functional gate structure of the second FET;
a gate cut region located between the first FET and the second FET; and
a via-to-backside power rail (VBPR) contact structure located in the gate cut region, wherein the VBPR contact structure has a first width in an area between the first source/drain region of the first FET and a first source/drain region of the second FET and between the second source/drain region of the first FET and a second source/drain region of the second FET, and a second width in area between the end wall of the functional gate structure of the first FET and the end wall of the functional gate structure of the second FET, wherein the first width is larger than the second width.

* * * * *